US011816357B2

(12) United States Patent
Veches et al.

(10) Patent No.: US 11,816,357 B2
(45) Date of Patent: Nov. 14, 2023

(54) VOLTAGE REGULATION DISTRIBUTION FOR STACKED MEMORY

(71) Applicant: Micron Technology, Inc., Boise, ID (US)

(72) Inventors: Anthony D. Veches, Boise, ID (US); Brian P. Callaway, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 17/400,914

(22) Filed: Aug. 12, 2021

(65) Prior Publication Data

US 2023/0046912 A1 Feb. 16, 2023

(51) Int. Cl.
*G06F 3/00* (2006.01)
*G06F 3/06* (2006.01)
*G11C 5/14* (2006.01)

(52) U.S. Cl.
CPC .......... *G06F 3/0659* (2013.01); *G06F 3/0604* (2013.01); *G06F 3/0679* (2013.01); *G11C 5/147* (2013.01)

(58) Field of Classification Search
CPC ....... G11C 5/025; G11C 5/04; G11C 11/4074; G11C 11/4093; G11C 11/406; G11C 11/4096; G11C 5/02; G11C 11/40; G11C 5/147; G11C 16/0483; G11C 16/08; G11C 16/30; G11C 11/2297; G11C 5/063; G11C 5/14; G11C 5/066; G11C 7/24; G11C 8/20; G11C 16/12; G11C 16/34;

(Continued)

(56) References Cited

U.S. PATENT DOCUMENTS

2009/0080279 A1 3/2009 Kim et al.
2019/0267071 A1 8/2019 Prather et al.
(Continued)

FOREIGN PATENT DOCUMENTS

WO 2016/114878 A1 7/2016

OTHER PUBLICATIONS

European Patent Office, "European search report", issued in connection with European Patent Application No. 22187253.4 dated Jan. 11, 2023 (8 pages).

*Primary Examiner* — Thong Q Le
(74) *Attorney, Agent, or Firm* — Holland & Hart LLP

(57) ABSTRACT

Methods, systems, and devices for voltage regulation distribution for stacked memory are described. A stacked memory device may support various techniques for coupling between voltage regulation circuitry of multiple memory dies, or for coupling of voltage regulation circuitry of some memory dies with circuitry associated with operating memory arrays of other memory dies. In some examples, such techniques may include cross-coupling of voltage regulation circuitry based on access activity or a degree of access activity for array circuitry. In some examples, such techniques may include isolating voltage regulation circuitry based on access activity or a degree of access activity for array circuitry. Dynamic coupling or isolation between voltage regulation circuitry may be supported by various signaling related to a stacked memory device, such as signaling between the stacked memory dies, signaling between a memory die and a central controller, or signaling between the stacked memory device and a host device.

35 Claims, 9 Drawing Sheets

(58) Field of Classification Search
CPC ...... G11C 2029/0403; G11C 29/12015; G11C 29/56004; G11C 5/141; G06F 13/1668; G06F 3/0604; G06F 3/0659; G06F 3/0679; G06F 1/206; G06F 21/73; G06F 21/79; G06F 3/0383; G06F 3/04897
See application file for complete search history.

(56) References Cited

U.S. PATENT DOCUMENTS

2019/0333550 A1   10/2019  Fisch
2021/0407572 A1*  12/2021  Song ........................ H01L 25/16

* cited by examiner

VOLTAGE REGULATION DISTRIBUTION FOR STACKED MEMORY

FIELD OF TECHNOLOGY

The following relates generally to one or more systems for memory and more specifically to voltage regulation distribution for stacked memory.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
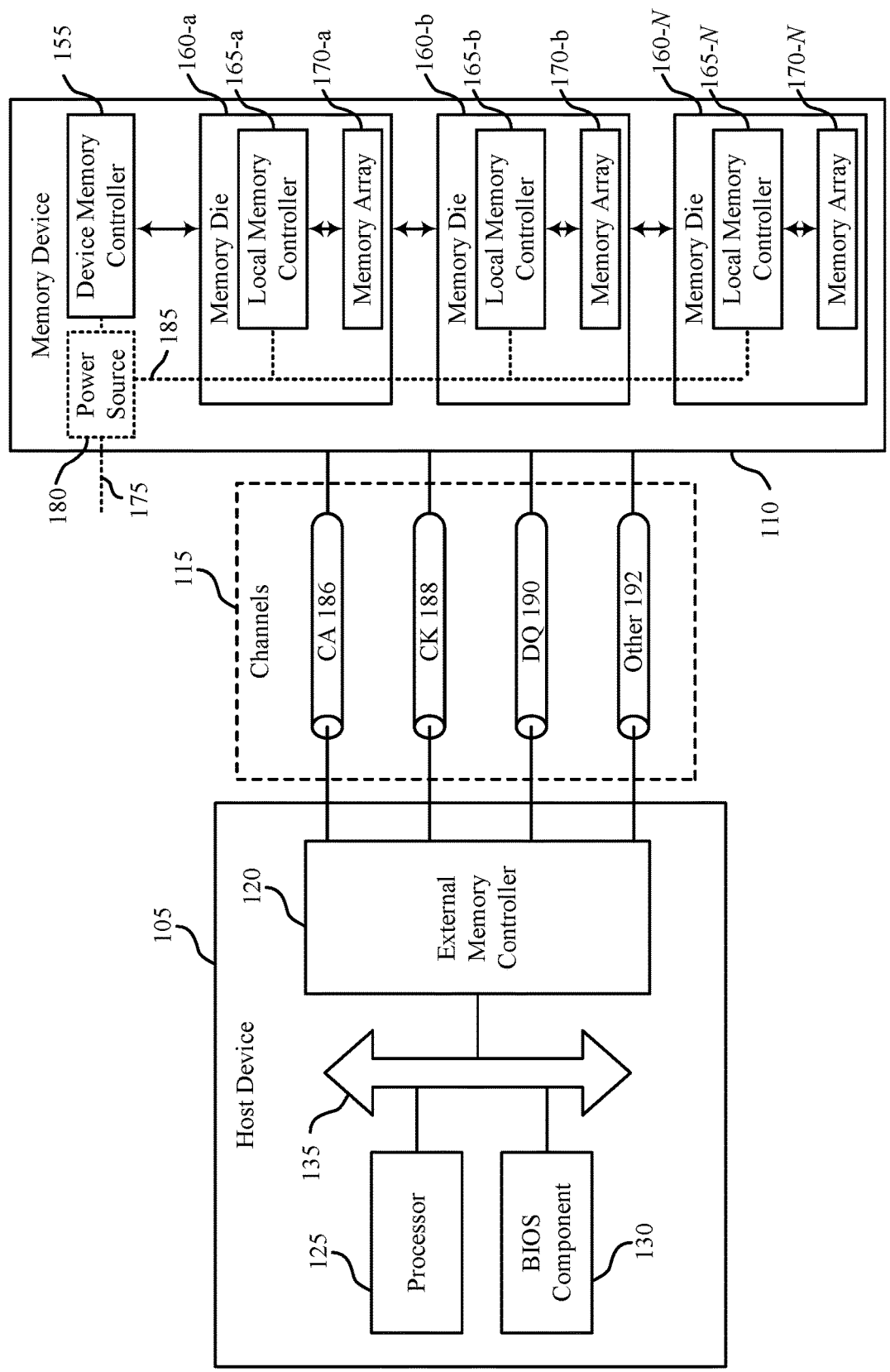
FIG. 1 illustrates an example of a system that supports voltage regulation distribution for stacked memory in accordance with examples as disclosed herein.

A memory device may include one or more memory dies, where each memory die may refer to a semiconductor component (e.g., chip) configured with a respective memory array and circuitry for operating at least the respective memory array (e.g., for supporting read operations, write operations, memory management operations). In some examples, a memory device may include multiple discrete memory dies that may be controlled or accessed by a host device via a common communicative link (e.g., via a common command and address channel or bus). A stacked memory device may refer to a memory device that includes multiple discrete memory dies that are coupled together (e.g., bonded, soldered, welded), where such coupling may include providing a physical or electrical interconnection between one or more electrical contacts of different memory dies (e.g., adjacent memory dies, directly adjacent memory dies). In some examples, a stacked memory device may include a power source that is common to (e.g., shared by) two or more of the memory dies, and each of the memory dies may include voltage regulation circuitry for operating the respective memory die in accordance with one or more regulated voltages.

In accordance with examples as disclosed herein, a stacked memory device may support various techniques for coupling between voltage regulation circuitry of multiple memory dies, or for coupling of voltage regulation circuitry of some memory dies with circuitry associated with operating memory arrays of other memory dies, or some combination. In some examples, such techniques may include cross-coupling of voltage regulation circuitry among different memory dies based on, among other factors and examples, access activity (e.g., a presence of access activity) or a degree of access activity for the array circuitry (e.g., relatively active accessing, access equal to or above a threshold rate, bandwidth, or performance criteria). In some examples, such techniques may include isolating voltage regulation circuitry among different memory dies based on, among other factors and examples, access activity (e.g., a lack of access activity) or a degree of access activity for the array circuitry (e.g., relatively infrequent accessing, access equal to or below a threshold rate, bandwidth, or performance criteria). Dynamic coupling or isolation between voltage regulation circuitry may be supported by various signaling of the stacked memory device, such as signaling between the stacked memory dies, signaling between a memory die and a central controller (e.g., of a logic die), or signaling between the stacked memory device and a host device, among other signaling. By providing coupling and isolation among voltage regulation circuitry of multiple memory dies in a stacked memory device, voltage regulation circuitry, or capacity thereof (e.g., a power rating thereof, a power supply thereof), can be distributed among the memory dies with improved characteristics, such as improved voltage stability, improved thermal distribution, or reduced noise, which may improve memory device performance compared to configurations where voltage regulation of a given memory die is used only within the same memory die.

Features of the disclosure are initially described in the context of systems, dies, and device as described with reference to FIGS. 1 through 4. These and other features of the disclosure are further illustrated by and described with reference to an apparatus diagram and flowcharts that relate to voltage regulation distribution for stacked memory as described with reference to FIGS. 5 through 9.

FIG. 1 illustrates an example of a system 100 that supports voltage regulation distribution for stacked memory in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and one or more memory arrays 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a memory device 110 may include a power source that is common to (e.g., shared by) multiple memory dies 160 of the memory device 110. For example, the memory device 110 may include a power source 180, which may be configured to provide power (e.g., convey power, supply power, via an output conductor 185) to each of the memory dies 160-*a* through 160-N. Although the output conductor 185 is illustrated as being coupled with a respective local memory controller 165 of each of the memory dies 160, a memory device 110 may include various configurations of an output conductor 185 for additionally or alternatively coupling a power source 180 with a set of memory arrays 170, or various components of a set of memory arrays 170. The power source 180 may be coupled with an input conductor 175 (e.g., a pin or contact of the memory device 110) which may or may not be coupled with or through the host device 105. Power may be supplied to the input conductor 175 by a power converter or voltage regulator (e.g., of the host device 105, of a device external to the host device 105), a battery, an electrical grid or distribution system, or other types of power sources or generators. Although a single output conductor 185 is illustrated in the memory device 110, a power source 180 may be associated with more than one output conductor 185, such as a pair of conductors that provide or convey power according to a voltage and a ground reference (e.g., a chassis ground conductor) or other reference voltage, or other quantities of conductors that may provide power according to one or more voltage levels.

In some examples, the power source 180 may be coupled with voltage regulation circuitry of the memory dies 160, where such voltage regulation circuitry may be configured to support operations of a respective memory die 160 at a regulated voltage (e.g., as a voltage source of the respective memory dies 160). For example, each memory die 160 may include components or circuitry configured for establishing one or more voltage levels used for operating the components of the memory die 160, including a respective local memory controller 165 or a respective memory array 170, among other components. The voltage regulation circuitry may include various configurations of components for establishing an operating voltage, or filtering noise or other fluctuations of an established voltage that may arise from or be based on fluctuations from the power source 180, or from fluctuations in load or other signal or voltage reflections related to operations of the respective memory die 160, among other sources. Although, in some examples, voltage regulation circuitry may be dedicated to a given memory die 160, such techniques may involve relatively large or relatively high-capacity voltage regulation circuitry on each memory die 160 to satisfy peak performance or power consumption demands of a given memory die 160. During peak performance or power consumption of one memory die 160, however, voltage regulation circuitry of one or more other memory dies 160 may be underutilized, such that voltage regulation circuitry of the memory device 110 as a whole may be over-provisioned.

In accordance with examples as disclosed herein, the memory device 110 may support various techniques for coupling voltage regulation circuitry between or among multiple memory dies 160. In some examples, such techniques may include an interconnection (e.g., a bus conductor), shared across multiple memory dies 160 (e.g., located through multiple memory dies 160), where a respective voltage regulator of each of the memory dies 160 may be coupled with the interconnection in a static (e.g., fixed) arrangement, or a dynamic (e.g., dynamic, selectable, switchable) arrangement, or a combination thereof. Various components of the memory dies 160 (e.g., a local memory controller 165 or a memory array 170, or any portion thereof or combination thereof, circuitry associated with a memory array 170 or operation thereof), which may be referred to as array circuitry, may be coupled with or operable to be coupled with (e.g., via a switching component) the voltage regulator interconnection, and the components of a given memory die 160 may operate based on the output of one or more voltage regulators, which may include one or more voltage regulators of other memory dies 160, and may or may not include an output of a voltage regulator of the given memory die 160.

In some examples, such techniques may include cross-coupling of voltage regulation circuitry among different memory dies based on, among other factors and examples, access activity (e.g., a presence of access activity) or a degree of access activity for the array circuitry (e.g., relatively active accessing, access equal to or above a threshold rate, bandwidth, or performance criteria). In some examples, such techniques may include isolating voltage regulation circuitry among different memory dies based on, among other factors and examples, access activity (e.g., a lack of access activity) or a degree of access activity for the array circuitry (e.g., relatively infrequent accessing, access equal to or below a threshold rate, bandwidth, or performance criteria). Dynamic coupling or isolation between voltage regulation circuitry may be supported by various signaling of the stacked memory device, such as signaling between the stacked memory dies, signaling between a memory die and a central controller (e.g., of a logic die), or signaling between the stacked memory device and a host device, among other signaling. By supporting coupling, isolation, or both among voltage regulation circuitry of multiple memory dies in a stacked memory device, voltage regulation circuitry, or capacity thereof (e.g., a power rating thereof, a power supply thereof), can be distributed among the memory dies with improved characteristics, such as improved voltage stability, improved thermal distribution, reduced noise, improved packaging flexibility, or component redundancy, among other benefits, which may improve memory device design or performance compared to configurations where voltage regulation of a given memory die is used only within the same memory die.

Figure 2:
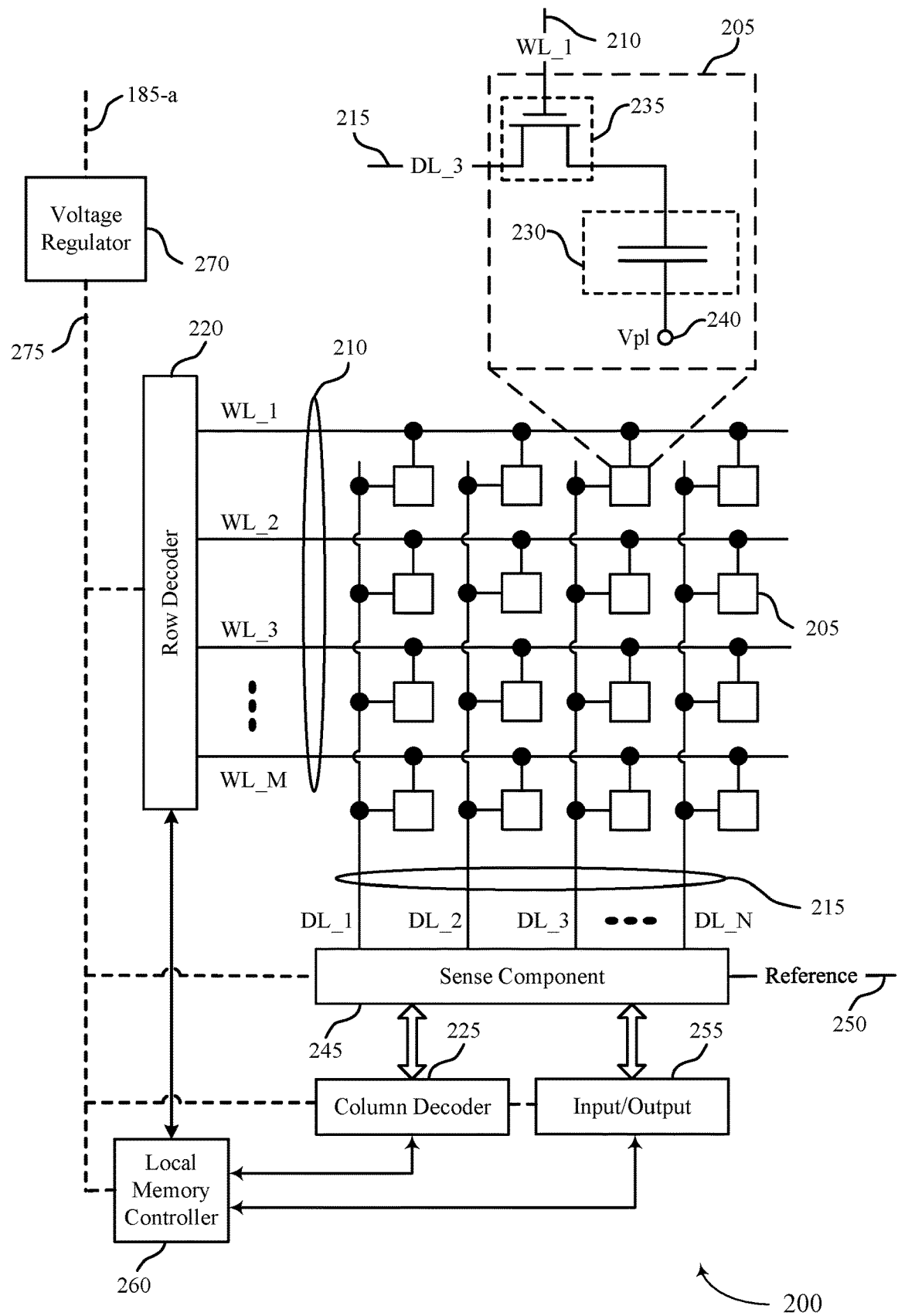
FIG. 2 illustrates an example of a memory die that supports voltage regulation distribution for stacked memory in accordance with examples as disclosed herein.

FIG. 2 illustrates an example of a memory die 200 that supports voltage regulation distribution for stacked memory in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output component 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

Various components of the memory die 200 may be coupled with a voltage regulator 270 of the memory die 200 (e.g., internal to the memory die 200, a voltage source of the memory die 200) for supporting various operations of the memory die 200, such as read operations, write operations, refresh operations, memory management operations, and other operations of the memory die 200. For example, a voltage regulator 270 may establish a voltage, or provide power according to an established voltage, to support storing logic states in memory cells 205, to refresh or maintain logic states stored at memory cell 205, to identify logic states stored in memory cells 205, to perform memory management operations (e.g., at a local memory controller 260), or to communicate information between the memory die 200 and a device memory controller 155 or a host device 105, among other operations. To support such operations, a voltage regulator 270 may be directly or indirectly coupled with a local memory controller 260, a row decoder 220, a column decoder 225, a sense component 245, a reference 250, an input/output component 255, or various other components of a memory die 200 or combinations thereof, over a bus 275 (e.g., a bus conductor, a voltage source conductor, a voltage bus). In some examples, a voltage regulator 270 may receive power from a power source 180 as described with reference to FIG. 1, including receiving power over an output conductor 185-a.

In accordance with examples as disclosed herein, a memory device 110 that includes multiple memory dies 200 may support various techniques for coupling voltage regulators 270 between or among the multiple memory dies 200. In some examples, such techniques may include an interconnection (e.g., a bus conductor), shared across multiple memory dies 200 (e.g., located through multiple memory dies 200), where a respective voltage regulator 270 of each of the memory dies 200 may be coupled with the interconnection in a static (e.g., fixed) arrangement, or a dynamic (e.g., dynamic, selectable, switchable) arrangement, or a combination thereof. Various components of the memory dies 200 (e.g., a row decoder 220, a column decoder 225, a sense component 245, an input/output component 255, or a local memory controller 260, or any portion thereof or combination thereof, among other circuitry or components), which may be referred to as array circuitry, may be coupled or operable to be coupled with (e.g., via a switching component) the voltage regulator interconnection. Components of a given memory die 200 may operate based on the output of one or more voltage regulators 270, which may include one or more voltage regulators 270 of other memory dies 200, and may or may not include an output of a voltage regulator 270 of the given memory die 200. By supporting coupling, isolation, or both among voltage regulation circuitry of multiple memory dies 200 in a stacked memory device 110, voltage regulation circuitry, or a capacity thereof (e.g., a power rating thereof, a power supply thereof), can be distributed among the memory dies 200 with improved characteristics. These characteristics may include improved voltage stability, improved thermal distribution, reduced noise, improved packaging flexibility, or component redundancy, among other benefits, which may improve memory device design or performance compared to configurations where a voltage regulator 270 of a given memory die 200 is used only within the same memory die 200.

Figure 3A:
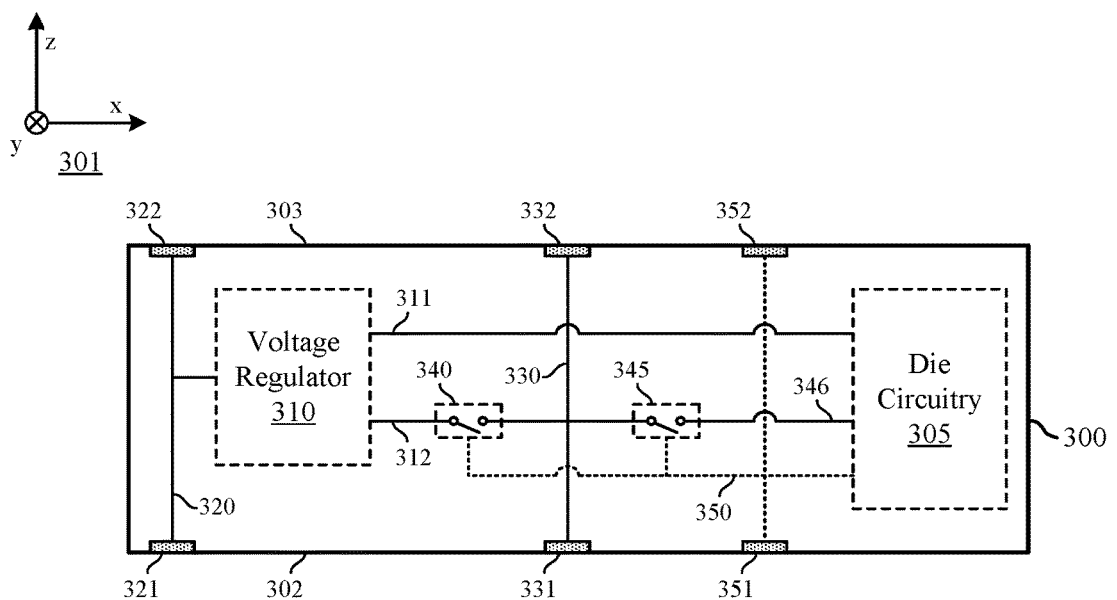
FIGS. 3A and 3B illustrate examples of a memory die and a memory device, respectively, that support voltage regulation distribution for stacked memory in accordance with examples as disclosed herein.
Figure 3B:
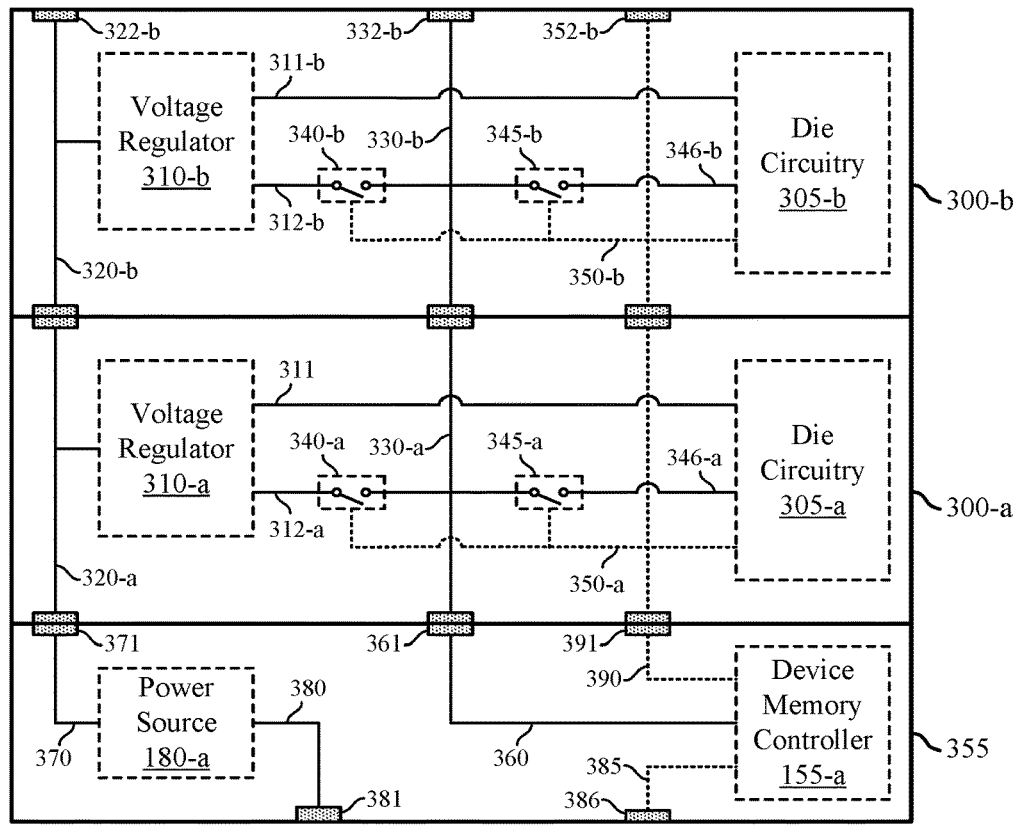

FIGS. 3A and 3B illustrate examples of a memory die 300 and a memory device 110-a, respectively, that support voltage regulation distribution for stacked memory in accordance with examples as disclosed herein. The memory die 300 may be an example of one or more aspects of a memory die 160 or a memory die 200 described with reference to FIGS. 1 and 2. For illustrative purposes, aspects of the memory die 300 and the memory device 110-a may be described with reference to an x-direction, a y-direction, and a z-direction of a coordinate system 301. In some examples, the z-direction may be illustrative of a direction relative to a substrate of the memory die 300 (e.g., a height direction, a build-up direction), or a direction of die stacking for the stacked memory device 110-a (e.g., a stack direction, a direction for stacking memory dies 300), or both.

The memory die 300 may be an example of a semiconductor die that includes one or more memory arrays, such as one or more memory arrays 170 described with reference to FIG. 1. The memory die 300 may be associated with (e.g., may have an exposed surface that includes, may have a physical boundary, volume, extent, or package that includes or is defined at least in part by) a first surface 302 (e.g., a bottom surface, a bottom surface of a memory chip) and a second surface 303 (e.g., a top surface, opposite the bottom surface along the z-direction, a top surface of a memory chip), each of which may be configured to be couplable with another component of a memory device 110 (e.g., in a stacked memory device 110).

The memory die 300 may include die circuitry 305, which may include various components or circuitry for operating the memory die 300 (e.g., circuitry associated with one or more memory arrays 170 of the memory die 300). In some examples, the die circuitry 305 may include the memory cells 205 of the one or more memory arrays 170 of the memory die 300. In some examples, the die circuitry 305 may include various components or circuitry for operating the one or more memory arrays 170 (e.g., for supporting access operations on the memory cells 205 of the memory die 300), such as one or more of a local memory controller 260, a row decoder 220, a column decoder 225, a sense component 245, a reference 250, or an input/output component 255, as described with reference to FIG. 2, or various other components or combinations of components.

The memory die 300 also may include a voltage regulator 310, which may include various components or circuitry for establishing an operating voltage (e.g., a voltage level) of at least the memory die 300. For example, the voltage regulator 310 may be configured to output a configured voltage that supports various operations of the memory die 300, including the die circuitry 305, among other components or circuitry. In various examples, the voltage regulator 310 may operate as a variable resistor, a voltage divider, a switching regulator, a shunt regulator, a series regulator, a fixed regulator, or a variable regulator, among other configurations. The voltage regulator also may include various filtering or other suppression components configured to reduce noise or otherwise mitigate fluctuations of a voltage output or otherwise regulated by the voltage regulator 310. In some examples, the voltage regulator 310 may receive power via a conductor 320, where the received power may be provided by a power source 180 described with reference to FIG. 1 (e.g., via an output conductor 185).

The memory die 300 may include various conductors or other components for distributing a voltage regulated by the voltage regulator 310, or distributing power according to a voltage regulated by voltage regulator 310, or both. For example, the memory die 300 may include a conductor 311 (e.g., a first voltage distribution conductor internal to the memory die 300) and a conductor 312 (e.g., a second voltage distribution conductor internal to the memory die 300), each of which may be configured to support an output of the voltage regulator 310. In the example of memory die 300, the conductor 311 may be associated with providing a regulated voltage directly to the die circuitry 305 (e.g., via one or more direct connections), and the conductor 312 may be associated with providing a regulated voltage to a conductor 330 (e.g., a voltage bus, a regulated voltage bus) via a switching component 340 (e.g., for selectively or dynamically coupling or isolating the voltage regulator 310 and a shared voltage bus, for providing power to the conductor 330 based on a state of the switching component 340). In various examples, the conductor 330 may support providing a regulated voltage, or providing power according to a regulated voltage, to a conductor 346 via a switching component 345 (e.g., for selectively or dynamically coupling or isolating the die circuitry 305 and a shared voltage bus, for providing power to the die circuitry 305 based on a state of the switching component 345). In some examples, power provided from the conductor 330 may include power provided from or regulated at least in part by components or circuitry outside the memory die 300 (e.g., from another memory die 300, from a logic die). Although one of each of the conductors 320, 311, 312, 330, and 346 are illustrated in the example of memory die 300, a memory die in accordance with the techniques disclosed herein may include any quantity of one or more conductors 320, one or more conductors 311, one or more conductors 312, one or more conductors 330, or one or more conductors 346 to support various configurations of voltage regulation distribution.

In some examples, the conductor 311 may be associated with providing a baseline regulated voltage, a baseline power, a dedicated voltage or power, an ongoing power, or an otherwise maintained power or regulated voltage while the memory die 300 is in an operable condition (e.g., while a memory device 110 that includes the memory die 300 is powered on). For example, the conductor 311 may be coupled with one or more local memory controllers 165 of the die circuitry 305 to provide a consistent power, or a consistent power at a certain regulated voltage, for various die-specific logic operations or memory management operations of the memory die 300 (e.g., operations that may be performed whether the memory die 300 or a memory device 110 that includes the memory die 300 is in an active mode or an inactive, standby, or idle mode). In some examples, the conductor 311 may be coupled with one or more transistors of the die circuitry 305 to maintain such transistors in a determinate state or condition while the switching components 340 or 345 may be in one state or another (e.g., opened or closed), or is switching from one state to another. In some examples, the conductor 311 may be associated with providing a degree of power, or power at a certain voltage, that is associated with a certain performance level of the die circuitry 305, or some portion thereof, such as a baseline bandwidth, a baseline rate or speed, or a baseline throughput.

In some examples, the conductor 311 may be directly coupled with a subset of one or more memory arrays 170 of a plurality of memory arrays 170, or a portion of a memory array 170 (e.g., a subarray), of the die circuitry 305, or various associated circuitry (e.g., corresponding to operation of the subset of memory arrays 170 or portion of a memory array 170). In some examples, such techniques may support a configured portion of the die circuitry 305 being consistently powered, which may correspond to a portion of the die circuitry 305 that is associated with relatively lower latency operations (e.g., being operable without a delay associated with changing a state of the switching components 340 or 345), or a portion of the die circuitry 305 that is periodically refreshed (e.g., a portion of the die circuitry 305 associated with volatile memory architecture or otherwise operating in a volatile mode), among other configurations. In some examples, the conductor 311 may be omitted from a memory die 300, such that a regulated voltage, or a power provided in accordance with a regulated voltage, may be supported via the conductor 330 dynamically based at least in part on a state of the switching component 345.

In some examples, the conductor 346 may be associated with providing an active-mode power, a supplemental power, a variable power, or an otherwise intermittent power that is based at least in part on a state of the switching component 345, where the switching component 345 may be operable to couple or isolate the conductor 330 and the conductor 346 (e.g., a conductor that is directly coupled with one or more components of the die circuitry 305, but may be isolated from the conductor 330 or the voltage regulator 310). In some examples, the conductor 346 may be coupled with one or more access line decoders, sense components, or I/O components, among other components that support active access operations on one or more memory arrays 170 of the die circuitry 305. In some examples, the conductors 330 and 346 may be associated with providing a degree of power, or power at a configured voltage, that is associated with a certain performance level of the die circuitry 305, or some portion thereof, such as a bandwidth that is greater than a baseline bandwidth, a rate or speed that is greater than a baseline rate or speed, or a throughput that is greater than a baseline throughput.

In some examples, the conductor 346 may be directly coupled with a subset of a plurality of memory arrays 170, or a portion of a memory array 170 (e.g., a subarray), of the die circuitry 305, or various associated circuitry (e.g., corresponding to operation of the subset of the plurality of memory arrays 170 or portion of the memory array 170). In some examples, such techniques may support a configured portion of the die circuitry 305 being intermittently powered, which may correspond to a portion of the die circuitry 305 that is associated with relatively higher latency operations (e.g., related to a delay associated with changing a state of the switching component 345 or other initialization upon powering), or a portion of the die circuitry 305 that does not involve periodic refreshing (e.g., a portion of the die circuitry 305 associated with a non-volatile memory architecture or otherwise operating in a non-volatile mode), or a portion of die circuitry 305 that may not be continuously operated (e.g., a memory array 170 or portion thereof that may be configurable to be inactive, idled, or otherwise made inoperative), among other configurations. In some examples, such techniques may support operation of a memory device 110 (e.g., that includes the memory die 300) with relatively smaller or relatively reduced capacity voltage regulators (e.g., due to intermittent powering of one or more portions of the die circuitry 305 of one or more memory dies 300), or with a relatively higher efficiency (e.g., due to reduced leakage or other reduced power consumption of portions of the die circuitry 305 that are made inactive), among other benefits.

In some examples, the switching component 340 may support a dynamic or opportunistic coupling of the voltage regulator 310 with the conductor 330. For example, the switching component 340 may be closed (e.g., made conductive) during conditions when the voltage regulator 310 has enough or excessive capacity relative to operating the die circuitry 305, or during conditions when the voltage regulator 310 can compensate for any noise, power draw, or other fluctuations induced upon coupling with the conductor 330 (e.g., upon coupling with one or more other memory dies 300, or other portions of a memory device 110, associated with a power draw from the conductor 330 or a voltage fluctuation to the conductor 330), or when power available from the voltage regulator 310 is commanded or requested from another component of a memory device 110 that includes the memory die 300. In some examples, the switching component 340 may be opened during conditions when a capacity of the voltage regulator 310 is required to support the die circuitry 305 of the memory die 300, or during conditions when the voltage regulator 310 may be involved in supporting operations of the die circuitry 305 that are sensitive to noise or other fluctuations, or when a capacity of the voltage regulator 310 is not needed or beneficial elsewhere in a memory device 110 that includes the memory die 300. In such scenarios, the voltage regulator 310 may be isolated from the conductor 330, and may provide power to the die circuitry 305 via the conductor 330 (e.g., rather than via the conductors 312, 330, and 346).

In some examples, the conductor 311 and the conductor 346 may be coupled with one or more common nodes of the die circuitry 305, such that closing a connection of the switching components 340 and 345 may provide a relatively lower impedance between the voltage regulator 310 and the one or more common nodes (e.g., associated with conductivity through both the conductor 311 and the conductors 312, 330, and 346), and opening the connection of one or both of the switching component 340 or the switching component 345 may provide a relatively higher impedance between the voltage regulator 310 and the one or more common nodes (e.g., associated with conductivity through the conductor 311 but not the conductors 312, 330, and 346). For example, the conductors 311 and 346 may converge at a common point of the memory die 300 (e.g., at a boundary of the die circuitry 305, internal to the die circuitry 305), or may be coupled with opposite sides of a common conductor internal to the die circuitry (e.g., to provide a regulated voltage at opposite ends of a common voltage or power distribution line or access line associated with operating the die circuitry 305). In some examples (e.g., when the conductors 311 and 346 are couplable with different portions of the die circuitry 305), opening either or both of the switching component 340 or the switching component 345 may be associated with isolating the voltage regulator 310 from at least a portion of the die circuitry 305. In some examples, opening the switching component 345 may be associated with isolating at least a portion of the die circuitry 305 from a regulated voltage altogether (e.g., where at least a portion of the die circuitry 305 is disconnected from both the voltage regulator 310 and the conductor 330).

In some examples, the conductors 320 and 330, or various portions thereof, may be formed according to various techniques that support a through-die arrangement. For example, conductors 320 or 330 may be formed with one or more portions extending perpendicular to the surface 302 or the surface 303 (e.g., extending along the z-direction, in a height direction relative to a substrate, such as one or more TSV segments of the memory die 200-$a$). In some examples, the conductors 320 and 330 may be formed with one or more portions extending parallel to the surface 302 or the surface 303 (e.g., extending in a direction perpendicular to the z-direction or in an xy-plane, such as a portion of an internal distribution or redistribution layer of the memory die 300).

A switching component 340 or a switching component 345 may be configured with various components or arrangements of components to support the described functionality of dynamic coupling or isolation. For example, a switching component 340 or a switching component 345 may be a dynamic or continuously operable or programmable switch, such as a transistor, which may be controlled (e.g., using a logical signal, using a control signal) to be in either a closed-circuit or open-circuit configuration. The state of a switching component 340 or a switching component 345 may be programmed or otherwise controlled using signaling via a conductor 350, or portion thereof (e.g., when the conductor 350 is a control bus having a plurality of signal-carrying paths). In various examples, a switching component 340 or a switching component 345 may be responsive to signaling from the die circuitry 305 (e.g., from a local memory controller 165 of the die circuitry 305), from another memory die 300 (e.g., from a local memory controller 165 of the other memory die 300), from logic shared by or otherwise operable to control operation of a plurality of memory dies 300 (e.g., from a device memory controller 155), or from a host device 105 coupled with a memory device 110 that includes the memory die 300.

Each of the conductors 320, 330, and 350 may be associated with one or more contacts at a surface of the memory die 300. In the example of memory die 300, the conductor 320 may be associated with a first contact 321, which may be coincident with the surface 302, and a second contact 322, which may be coincident with the surface 303. Further, the conductor 330 may be associated with a first contact 331, which may be coincident with the surface 302, and a second contact 332, which may be coincident with the surface 303. Further, the conductor 350 may be associated with a first contact 351, which may be coincident with the surface 302, and a second contact 352, which may be coincident with the surface 303.

In some examples, one or more contacts 321, one or more contacts 322, one or more contacts 331, one or more contacts 332, one or more contacts 351, or one or more contacts 352, or any combination thereof may be included in or referred to as a ball grid array, a land grid array, or other configuration. Each of the contacts 321, 322, 331, 332, 351, or 352 may be physically couplable, electrically couplable, or both physically and electrically couplable with another component external to the memory die 300, and may include or be referred to as a bonding pad, a contact pad, a soldering pad, a wire bonding pad, a wedge bonding pad, or an electrical contact, among other constructs or terminology. In some examples, contacts 321 or 322 may each be configured to be couplable with a power source 180 (e.g., for coupling with a contact of a component that includes the power source 180, for coupling with a contact of another memory die 300 that includes a conductive path that is coupled or couplable with the power source 180). In some examples, contacts 331 or 332 may each be configured to be couplable with, or otherwise form a portion of a regulated voltage bus for distributing a regulated voltage, or distributing power according to a regulated voltage, between or among a set of memory dies 300. In some examples, contacts 351 or 352 may each be configured to be couplable with, or otherwise form a portion of a control bus for exchanging signaling or information with or between memory dies 300. In some examples, contacts 321, 322, 331, 332, 351, or 352, or any combination thereof, may be configured to be couplable with another memory die 300 (e.g., with contacts 321, 322, 331, 332, 351, or 352 of another memory die 300).

FIG. 3B illustrates an example of a memory device 110-$a$ that includes a plurality of memory dies 300 (e.g., memory dies 300-$a$ and 300-$b$, a stack of memory dies 300) as described with reference to FIG. 3A. The memory dies 300-$a$ and 300-$b$ may be stacked over or upon (e.g., stacked above) a base 355, which may be an example of a semiconductor die, a printed circuit board (PCB), or other substrate component of the memory device 110-$a$ for constructing or supporting a stacked memory assembly. In some examples, a base 355 may be referred to as a logic die of a memory device 110, and may refer to a semiconductor die that is separate from one or more memory dies 300 of a memory device 110. Although the example of memory device 110-$a$ includes two memory dies 300, the described techniques may be applied in a memory device 110 that includes any quantity of memory dies 300.

In various examples of a stacked memory device 110, such as the memory device 110-$a$, one or more memory dies 300 and a base 355 may be assembled together (e.g., bonded, connected) using various techniques, such as soldering (e.g., using a reflow oven, using an infrared heater), bonding (e.g., thermosonic bonding, thermocompression bonding, wire bonding, wedge bonding), brazing, welding (e.g., ultrasonic welding, pressure welding), or other joining techniques. In some examples, the memory device 110-$a$ may include one or more bonding layers (not shown) between respective assembled components, where the bonding layers may include conductive material portions in contact with various contacts of the assembled components, for providing a respective electrical coupling or interconnection. In various examples, a conductive material portions may include solder (e.g., solder balls), brazing, conductive paste, conductive wires, spring connectors, or other features or materials that provide an electrical interconnection between assembled components of the memory device 110-$a$.

The base 355 may include a power source 180-$a$ that may be external to the memory dies 300. The power source 180-$a$ may be an example of one or more aspects of a power source 180 described with reference to FIGS. 1 and 2 and, in some examples, may include or be referred to as a voltage source or voltage regulator. The power source 180-$a$ may receive power over one or more input conductors (e.g., an input conductor 380 via a contact 381) of the base 355, which may be couplable with a host device 105 (e.g., a power supply or power supply pin of the host device 105) or another power supply.

In the example of memory device 110-$a$, the power source 180-$a$ may be configured for providing power to each of the memory dies 300-$a$ and 300-$b$ via the conductor 370 and associated contact 371. In various examples, the power source 180-$a$ may be configured to provide power according to a voltage level, or according to a first voltage level and a second voltage level, such as a positive voltage and a ground voltage, or a positive voltage and a negative voltage, or two positive voltages, among other configurations of one or more voltage levels. In some examples, the base 355 and the memory dies 300-*a* and 300-*b* may share one or more separate ground connections, chassis ground connections, return connections, or other voltage reference or current path connections via one or more additional conductors and contacts (not shown).

The base 355 also may include a device memory controller 155-*a*, which may be in communication with one or more of (e.g., all of) the memory dies 300 of the memory device 110-*a* (e.g., via one or more conductors 390 and associated contacts 391 of the base 355). The device memory controller 155-*a* may be operable for communication or other coupling or interconnection with a host device 105 (e.g., via channels 115, via one or more conductors, such as conductor 385 and associated contact 386 of the base 355). In some examples, two or more of (e.g., all of) the memory dies 300 of the memory device 110-*a* (e.g., one or more memory arrays 170 of each of the memory dies 300, memory cells 205 of each of the memory dies 300) may be addressable via a same or common communicative connection of the memory device 110, such as a common command/address bus of the memory device 110 or between the memory device 110 and a host device 105. In some examples, the device memory controller 155-*a* may monitor one or more conditions of a shared voltage bus (e.g., including the conductors 330-*a* and 330-*b*), and such monitoring may be supported at least in part by a conductor 360 and an associated contact 361 that are coupled with the shared voltage bus. In some examples, the device memory controller 155-*a* may be powered at least in part using power conveyed via the conductor 360 (e.g., power provided via one or both of the voltage regulators 310-*a* or 310-*b*), or the device memory controller 155-*a* may use an electrical condition (e.g., a voltage level, a voltage waveform, a voltage disturbance) conveyed over the conductor 360 to perform various operations.

The memory device 110-*a* may be configured to support various techniques for dynamic voltage regulation distribution, which may include various techniques for operating switching components 340, switching components 345, or both switching components 340 and switching components 345 of the memory dies 300 for various interconnection between or among the respective voltage regulators 310 and die circuitry 305.

In some examples, each of the switching components 345 may be nominally or ordinarily operated in a normally-open condition, such that a given switching component 345 is closed in advance of or in response to an elevated power consumption or other relatively high-activity or relatively high-performance condition that may benefit from a connection with one or more voltage regulators 310 (e.g., of a same memory die, of a different memory die 300, via one or more conductors 330). For example, in a nominal, baseline, default, idle, or standby condition, both of the switching components 345-*a* and 345-*b* may be in an open-circuit state. The switching component 345-*a* may be modified to a closed-circuit state (e.g., closed, connected, activated, made conductive) in response to or in advance of activity associated with the die circuitry 305-*a* (e.g., an access operation associated with memory cells of the die circuitry 305-*a*, a transition to a relatively higher bandwidth of information transfer of the die circuitry 305-*a*, a memory management operation of the die circuitry 305-*a*, a power mode, or a performance mode). In some examples, such an activation may be accompanied with a command, a request, or other signal to close one or both of the switching components 340-*a* or 340-*b* (e.g., from the memory die 300-*a*, from the memory die 300-*b*, from the device memory controller 155-*a*), which may be associated with increasing a voltage regulation capacity or a power supply capacity of the shared voltage bus including conductors 330-*a* and 330-*b*, or such an activation may be supported by a condition where one or both of the switching components 340-*a* or 340-*b* are maintained in a closed-circuit state.

In some examples, the memory die 300-*a* or the die circuitry 305-*a* itself may identify a power condition of the die circuitry 305-*a* (e.g., using a local memory controller of the memory die 300-*a*), and may activate the switching component 340-*a* or the switching component 345-*a* using signaling over the conductor 350-*a* (e.g., between a local memory controller 165 of the memory die 300-*a* and the switching component 345-*a*). In some examples, the device memory controller 155-*a* may identify a power condition of the die circuitry 305-*a* (e.g., a presence or degree of access activity), or may identify a condition of the regulated voltage bus (e.g., via conductor 360), and may activate the switching component 345-*a* using signaling via the conductors 390 and 350-*a* (e.g., as a command, a request, or an activation signal, between device memory controller 155-*a* and the switching component 345-*a*), which may be associated with signaling over the conductor 350-*a* that may or may not be relayed, processed, or evaluated by a local memory controller 165 (e.g., of the die circuitry 305-*a*). In some examples, the die circuitry 305-*a* or another portion of the memory die 300-*a*, or of the device memory controller 155-*a*, or both may include power monitoring or other electrical monitoring circuitry (e.g., voltage detection circuitry, current detection circuitry, temperature detection circuitry), and may activate the switching component 345-*a* based on various conditions such as an indication of an operating voltage or an operating current (e.g., a voltage droop equal to or below a voltage threshold, a current draw equal to or above a current threshold), among other conditions. In some examples, the memory die 300-*a* (e.g., a local memory controller 165 of the memory die 300-*a*) or the device memory controller 155-*a* may activate the switching component 345-*a* based at least in part on a command (e.g., an access command, a power command, a performance mode command) received from a host device 105. In these and other examples, maintaining the switching component 345-*b* in an open-circuit state (e.g., isolating at least a portion of the die circuitry 305-*b* from one or both of the voltage regulators 310-*a* or 310-*b*, maintaining a relatively high impedance between the voltage regulator 310-*b* and the die circuitry 305-*b*) may support improved operation of one or more components of the die circuitry 305-*a* relative to if the switching component 345-*b* was closed.

In some examples, each of the switching components 345 may be nominally or ordinarily operated in a normally-closed condition, such that a given switching component 345 of one memory die 300 is opened in advance of or in response to an elevated power consumption or other relatively high-activity condition of a different memory die 300 that may benefit from a connection with one or more voltage regulators 310 (e.g., of a same memory die, of a different memory die 300, via one or more conductors 330). For example, in a nominal, baseline, or default condition, both of the switching components 345-*a* and 345-*b* may be in a closed-circuit state. The switching component 345-*a* may be modified to an open-circuit state (e.g., opened, isolated, deactivated, made non-conductive) in response to or in advance of activity associated with the die circuitry 305-*b* (e.g., an access operation associated with memory cells of the die circuitry 305-*b*, a transition to a relatively higher bandwidth of information transfer of the die circuitry 305-*b*, a memory management operation of the die circuitry 305-*b*, a power mode of the die circuitry 305-*b*, or an elevated performance mode of the die circuitry 305-*b*). In some examples, such a deactivation may be accompanied with a command, a request, or another signal (e.g., from the memory die 300-*a*, from the memory die 300-*a*, from the device memory controller 155-*a*) to close one or both of the switching components 340-*a* or 340-*b*, which may be associated with increasing a voltage regulation capacity or a power supply capacity of the shared voltage bus including conductors 330-*a* and 330-*b*, or such a deactivation may be supported by a condition where one or both of the switching components 340-*a* or 340-*b* are maintained in a closed-circuit state.

Additionally or alternatively, a given switching component 345 of one memory die 300 may be opened in advance of or in response to a reduced power consumption or other relatively low-activity condition of the same memory die 300. For example, the switching component 345-*a* may be modified to an open-circuit state in response to or in advance of the die circuitry 305-*a* of the memory die 300-*a*, or some portion thereof, entering an idle or standby condition. In some examples, such a deactivation may be accompanied with or based on a command or a request to open one or both of the switching components 340-*a* or 340-*b* (e.g., to decrease a voltage regulation or power supply capacity of the shared voltage bus including conductors 330-*a* and 330-*b*), or may be supported by a condition where one or both of the switching components 340-*a* or 340-*b* are maintained in an open-circuit state.

In some examples, the memory die 300-*a* or the die circuitry 305-*a* itself may identify a power condition of the die circuitry 305-*a* (e.g., using a local memory controller of the memory die 300-*a*), and may deactivate the switching component 345-*a* using signaling over the conductor 350-*a* (e.g., between a local memory controller 165 of the memory die 300-*a* and the switching component 345-*a*). In some examples, the memory die 300-*b* may identify a power condition of the die circuitry 305-*b*, and may cause the switching component 345-*a* to be deactivated using signaling via the conductors 350-*b* and 340-*b* (e.g., as a command, a request, or a deactivation signal, between the memory die 300-*b* and the switching component 345-*a*), which may be associated with signaling over the conductor 350-*a* that may or may not be relayed, processed, or evaluated by a local memory controller 165 (e.g., of the die circuitry 305-*a*).

In some examples, the device memory controller 155-*a* may identify a power condition of the die circuitry 305-*a* or the die circuitry 305-*b*, or of the shared voltage bus that includes the conductors 330-*a* and 330-*b* (e.g., via the conductor 360) and may deactivate the switching component 345-*a* using signaling via the conductors 390 and 350-*a* (e.g., as a command, request, or activation signal, between device memory controller 155-*a* and the switching component 345-*a*), which may be associated with signaling over the conductor 350-*a* that may or may not be relayed, processed, or evaluated by a local memory controller 165 (e.g., of the die circuitry 305-*a*). For example, before deactivating the switching component 345-*a*, a controller or circuitry of the memory die 300-*a* may evaluate a request or other signal received at the memory die 300-*a* (e.g., from the memory die 300-*b*, from the device memory controller 155-*a*), such as evaluating whether an operating mode or power condition of the memory die 300-*a* supports the deactivation of the switching component 345-*a*, in which case such a request or signal may be accepted or rejected. In some examples, a command or other signal received at the memory die 300-*a* (e.g., a direct deactivation signal) may be assumed to be accepted, forwarded, or otherwise operable to deactivate the switching component 345-*a*. In some examples, the device memory controller 155-*a* may deactivate the switching component 345-*a* based at least in part on a command (e.g., an access command, a power command, a performance mode command) received from a host device 105. In these and other examples, transitioning the switching component 345-*a* to an open-circuit state (e.g., isolating at least a portion of the die circuitry 305-*a* from one or both of the voltage regulators 310-*a* or 310-*b*, maintaining a relatively high impedance between the voltage regulator 310-*a* and the die circuitry 305-*a*) may support improved operation of one or more components of the die circuitry 305-*b* relative to if the switching component 345-*a* was closed.

Although the memory device 110-*a* is illustrated as having faces of the memory dies 300 and the base 355 being exposed, in some examples, one or more of the faces of a memory device 110 may be covered or coated by a secondary material, such as a dielectric material or a plastic coating, among other coatings, to protect internal components of the memory device 110. In the example of memory device 110-*a*, such a material may at least partially if not fully cover the contacts 322-*b*, 332-*b*, and 352-*b* of the memory die 300-*b*, but may not cover the contacts 381 and 386 of the base 355. In some examples, one or more portions of the memory device 110-*a* may be provided with a metallization or other conductive material portion on one or more outside surfaces of memory dies 300 or a base 355 (e.g., at least a portion of a top surface of the memory die 300-*b*, one or more side surfaces of memory dies 300-*a* or 300-*b* or base 355), which may provide a degree of electromagnetic shielding for at least a portion of the memory dies 300 or the base 355.

Although some aspects of the memory dies 300 and the memory device 110-*a* are described and illustrated with reference to interconnection of voltage regulators 310 associated with a single regulated voltage level, a memory die 300 or memory device 110 may include various arrangements for interconnection among voltage regulators 310 that support multiple voltage levels. In such examples, one or more voltage regulators 310 of each memory die 300 may support direct or static connections with die circuitry 305, or some portion thereof, or one or more voltage regulators 310 of each memory die 300 may support selectable or dynamic connections with die circuitry 305, or various combinations thereof. In some examples, one or more voltage regulators 310 may additionally or alternatively support operations of various components or circuitry of a base 355, such as supporting operations of a device memory controller 155.

In some examples, the conceptual arrangement of contacts 331 and 332, conductors 312, 330 and 346, or switching components 340 and 345 may be functionally repeated for one or more voltage regulators associated with different voltage levels. For example, such a conceptual layout, or some portion thereof, may be functionally repeated to support one or more of a drain power voltage (e.g., VDD), a source power voltage (e.g., VSS, a ground voltage), a positive pump voltage (e.g., VPP), a reference voltage (e.g., VREF), a substrate power voltage (e.g., VBB, a negative voltage), or various other voltages or combinations thereof. Additionally or alternatively, the conceptual arrangement of contacts 331 and 332, conductors 312, 330 and 346, or switching components 340 and 345, as applied to a single connection with a single die circuitry 305 in FIG. 3B, may be functionally repeated for multiple connections with a single die circuitry 305 of a memory die 300, functionally repeated for connections with multiple die circuitry 305 of a memory die 300, or various combinations thereof (not illustrated). In these and other examples, respective contacts and conductors of functionally repeated layouts may be distributed across different portions of a memory die 300 to maintain electrical isolation between the functionally repeated layouts, such as having contacts and conductors distributed across different positions in the x-direction, different positions in the y-direction, or both.

In some examples, one or both of the switching components 340 or 345 may be omitted from memory dies 300 to support alternative implementations of voltage regulation distribution in a memory device 110. For example, switching components 340 may be omitted in implementations where the voltage regulator 310 of each memory die 300 is directly connected to a shared voltage bus (e.g., directly connected to a respective conductor 330). In such implementations, a full capacity of all of the voltage regulators 310 in a memory device 110 may be available on the shared voltage bus that includes the respective conductors 330, and switching components 345 may be included to dynamically couple one or more instances of die circuitry 305 to the shared voltage bus based on various conditions or criteria. In some examples, switching components 345 may be omitted in implementations where die circuitry 305 of each memory die 300 is directly connected to a shared voltage bus (e.g., directly connected to a respective conductor 330). In such implementations, switching components 340 may be included to dynamically couple one or more voltage regulators 310 to the shared voltage bus based on various conditions or criteria, which may vary a power or voltage regulation capacity available on the shared voltage bus. In some examples, conductors 311 may be omitted from memory dies 300 to support alternative implementations of voltage regulation distribution in a memory device 110. In such examples, switching components 340, switching components 345, or both may be included to support various techniques for dynamic coupling between voltage regulators 310 and die circuitry 305 that omit one or more aspects of a static coupling provided via a conductor 311.

Figure 4:
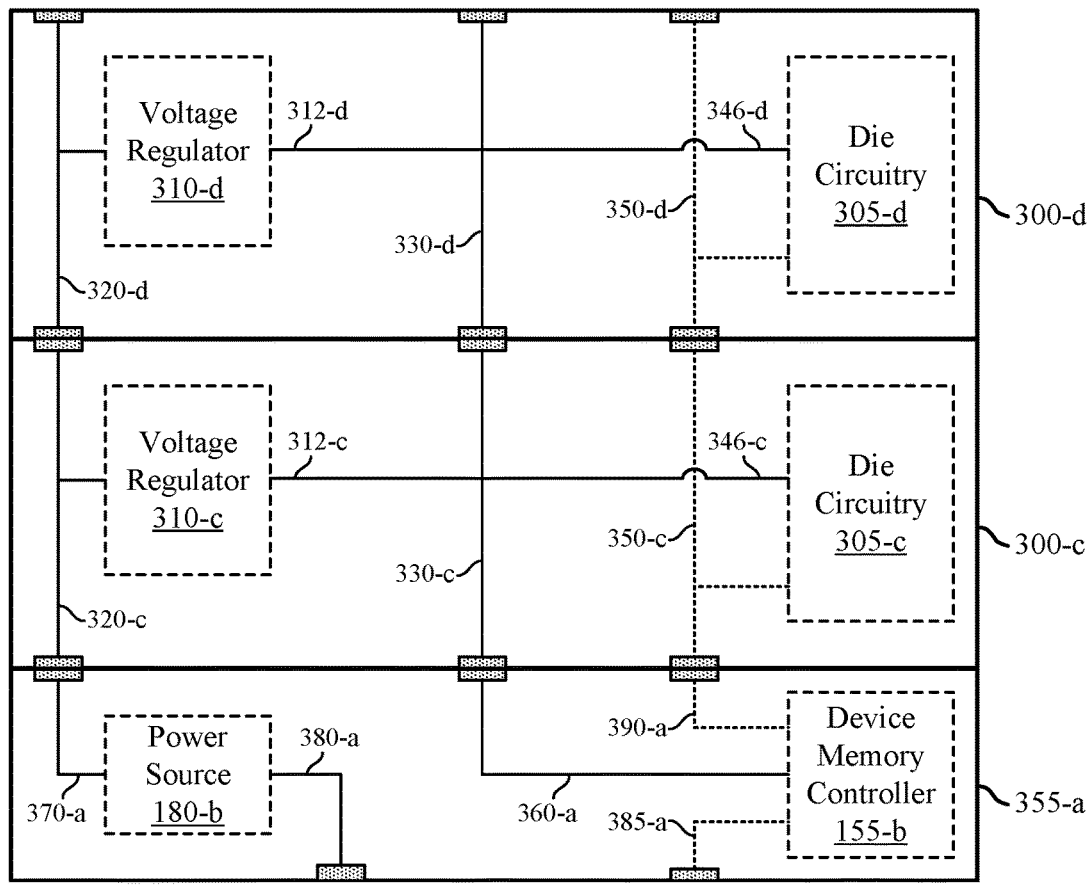
FIG. 4 illustrates an example of a memory device that supports voltage regulation distribution for stacked memory in accordance with examples as disclosed herein.

FIG. 4 illustrates an example of a memory device 110-b including memory dies 300-c and 300-d that support voltage regulation distribution for stacked memory in accordance with examples as disclosed herein. The memory dies 300-c and 300-d may be an example of one or more aspects of a memory die 160, a memory die 200, or a memory die 300 described with reference to FIGS. 1 through 3. The memory dies 300-c through 300-e may be stacked upon (e.g., stacked above) a base 355-a. The base 355-a may include a device memory controller 155-b, a power source 180-b, and conductors 360-a, 370-a, 380-a, 385-a, and 390-a, each of which may be an example of one or more aspects the respective components described with reference to FIG. 3B. Although the example of memory device 110-b includes two memory dies 300, the described techniques may be applied in a memory device 110 that includes any quantity of memory dies 300.

In the example of memory device 110-b, each of the memory dies 300 may include respective die circuitry 305, voltage regulators 310, and conductors 320, 312, 330, 346, and 350, each of which may be an example of one or more aspects the respective components described with reference to FIGS. 3A and 3B. However, in the example of memory device 110-b, each of the memory dies 300 may omit a switching component 340 and a switching component. Accordingly, respective conductors 312, 330, and 346 may be directly connected (e.g., as a common node, as a direct interconnection), which may illustrate an example of a static voltage regulation distribution. Accordingly, the collective capacity of the voltage regulators 310-c and 310-d may be shared by the die circuitry 305-c and 305-d, or by the die circuitry 305-c and 305-d and the device memory controller 155-b, among other circuitry or components, without dynamic switching. Such an implementation may be associated with reduced switching and logic complexity compared to the memory device 110-a described with reference to FIG. 3B, but may benefit from the distribution of voltage regulation capacity across multiple memory dies 300. For example, such an implementation may be associated with improved layout flexibility, improved thermal distribution, or other benefits compared to other techniques where voltage regulation circuitry is not shared among multiple memory dies 300.

In some examples, the conceptual arrangement of contacts and conductors of the memory device 110-b may be functionally repeated for one or more voltage regulators associated with different voltage levels. For example, such a conceptual layout, or some portion thereof, may be functionally repeated to support one or more of a drain power voltage (e.g., VDD), a source power voltage (e.g., VSS, a ground voltage), a positive pump voltage (e.g., VPP), a reference voltage (e.g., VREF), a substrate power voltage (e.g., VBB, a negative voltage), or various other voltages or combinations thereof. Additionally or alternatively, the conceptual arrangement of contacts and conductors, as applied to a single connection with a single die circuitry 305 in FIG. 4, may be functionally repeated for multiple connections with a single die circuitry 305 of a memory die 300, functionally repeated for connections with multiple die circuitry 305 of a memory die 300, or various combinations thereof (not illustrated). In these and other examples, respective contacts and conductors of functionally repeated layouts may be distributed across different portions of a memory die 300 to maintain electrical isolation between the functionally repeated layouts, such as having contacts and conductors distributed across different positions in the x-direction, different positions in the y-direction, or both. Further, in some examples, one or more aspects of static voltage regulation distribution as described with reference to, for example, FIG. 4 (e.g., as applied to some voltage levels or functional components of a memory device) may be combined with one or more aspects of dynamic voltage regulation distribution as described with reference to, for example, FIGS. 3A and 3B (e.g., as applied to other voltage levels or functional components of the memory device).

Figure 5:
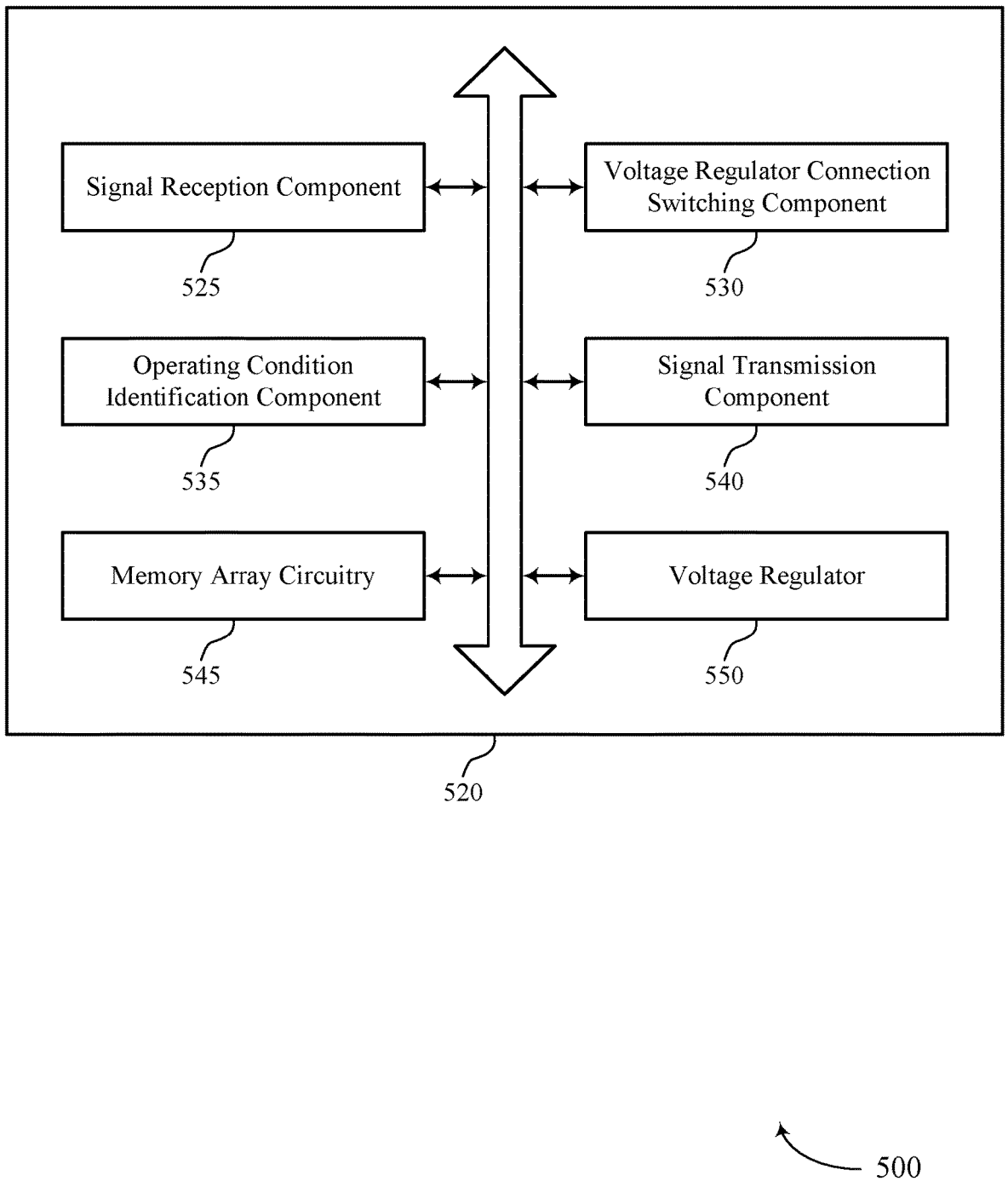
FIG. 5 shows a block diagram of a semiconductor die that supports voltage regulation distribution for stacked memory in accordance with examples as disclosed herein.

FIG. 5 shows a block diagram 500 of a semiconductor die 520 that supports voltage regulation distribution for stacked memory in accordance with examples as disclosed herein. The semiconductor die 520 may be an example of aspects of a semiconductor die (e.g., a memory die) as described with reference to FIGS. 1 through 4. The semiconductor die 520, or various components thereof, may be an example of means for performing various aspects of voltage regulation distribution for stacked memory as described herein. For example, the semiconductor die 520 may include a signal reception component 525, a voltage regulator connection switching component 530, an operating condition identification component 535, a signal transmission component 540, memory array circuitry 545, or a voltage regulator 550, or any combination thereof. Each of these components may communicate, directly or indirectly, with one another (e.g., via one or more buses).

The memory array circuitry 545 may include various components of circuitry associated with operating an array of memory cells 205. In some examples, the memory array circuitry 545 may include one or more memory arrays 170. In some examples, the memory array circuitry 545 may include various circuitry associated with accessing memory cells 205, including one or more of a row decoder 220, a column decoder 225, a sense component 245, or an input/output component 255, or any combination thereof. In some examples, the memory array circuitry 545 may include a local memory controller 260, or some portion thereof. However, in some examples, at least a portion of a local memory controller 260 may be associated with a consistent or static power supply or voltage regulator, in which case a local memory controller 260 may or may not be considered to be included in the memory array circuitry 545. For example, in some implementations, the signal reception component 525, the voltage regulator connection switching component 530, the operating condition identification component 535, or the signal transmission component 540, or any combination thereof, may be part of a local memory controller 260 that is consistently powered by a power source or voltage regulator, which may or may not be the same voltage regulator that is dynamically couplable with the memory array circuitry 545 using a switching component, such as a switching component 340 or a switching component 345.

In some examples, the semiconductor die 520 may be an example of a first semiconductor die including circuitry associated with a first memory array (e.g., memory array circuitry 545) and a voltage regulator (e.g., voltage regulator 550), which may be operable to support access or other operations of the circuitry associated with the first memory array. The semiconductor die 520 may include a contact coupled with a second semiconductor die, where the second semiconductor die may include circuitry associated with a second memory array. In some examples, the signal reception component 525 may be configured as or otherwise support a means for receiving a signal, and the voltage regulator connection switching component 530 may be configured as or otherwise support a means for modifying, based at least in part on the signal reception component 525 receiving the signal, a state of a switching component between the voltage regulator 550 and the contact coupled with the second semiconductor die.

In some examples, to support receiving the signal, the signal reception component 525 may be configured as or otherwise support a means for receiving, from the second semiconductor die, a request to modify the state of the switching component.

In some examples, to support receiving the signal, the signal reception component 525 may be configured as or otherwise support a means for receiving, from a third semiconductor die that is coupled with the semiconductor die 520 and the second semiconductor die, a command to modify the state of the switching component.

In some examples, to support receiving the signal, the signal reception component 525 may be configured as or otherwise support a means for receiving, from a host device coupled with a memory device that includes the semiconductor die 520 and the second semiconductor die, a command to modify the state of the switching component.

In some examples, the signal may include an indication of a condition of operating the circuitry associated with the second memory array. In various examples, the indication of the condition of operating the circuitry associated with the second memory array may include an indication of a bandwidth, an indication of a performance mode, an indication of a power mode, an indication of a voltage, an indication of a current, or an indication of an access status, or a combination thereof.

In some examples, modifying the state of the switching component may isolate the voltage regulator 550 from the memory array circuitry 545.

In some examples, to support modifying the state of the switching component, the voltage regulator connection switching component 530 may be configured as or otherwise support a means for transitioning the state of the switching component from a closed-circuit state to an open-circuit state based at least in part on the signal reception component 525 receiving the signal. In some examples, the signal reception component 525 may be configured as or otherwise support a means for receiving a second signal, and the voltage regulator connection switching component 530 may be configured as or otherwise support a means for modifying, based at least in part on the signal reception component 525 receiving the second signal, the state of the switching component from the open-circuit state to the closed-circuit state.

In some examples, to support modifying the state of the switching component, the voltage regulator connection switching component 530 may be configured as or otherwise support a means for transitioning the state of the switching component from an open-circuit state to a closed-circuit state based at least in part on the signal reception component 525 receiving the signal. In some examples, the signal reception component 525 may be configured as or otherwise support a means for receiving a second signal, and the voltage regulator connection switching component 530 may be configured as or otherwise support a means for modifying, based at least in part on the signal reception component 525 receiving the second signal, the state of the switching component from the closed-circuit state to the open-circuit state.

In some examples, the operating condition identification component 535 may be configured as or otherwise support a means for identifying a condition of operating the memory array circuitry 545, and the voltage regulator connection switching component 530 may be configured as or otherwise support a means for modifying, based at least in part on the operating condition identification component 535 identifying the condition of operating the operating condition identification component 535, a state of a switching component between the memory array circuitry 545 and a contact operable to couple with a second voltage regulator of a second semiconductor die.

In some examples, to support modifying the state of the switching component based at least in part on the operating condition identification component 535 identifying the condition of operating the memory array circuitry 545, the voltage regulator connection switching component 530 may be configured as or otherwise support a means for transitioning the state of the switching component from an open-circuit state to a closed-circuit state based at least in part on the operating condition identification component 535 identifying the condition of operating the memory array circuitry 545.

In some examples, to support modifying the state of the switching component based at least in part on the operating condition identification component 535 identifying the condition of operating the memory array circuitry 545, the voltage regulator connection switching component 530 may be configured as or otherwise support a means for transitioning the state of the switching component from a closed-circuit state to an open-circuit state based at least in part on the operating condition identification component 535 identifying the condition of operating the memory array circuitry 545.

In some examples, the signal transmission component 540 may be configured as or otherwise support a means for transmitting a signal to the second semiconductor die, the signal to modify a state of a second switching component between a voltage regulator of the second semiconductor die and a contact of the second semiconductor die coupled with the first semiconductor die.

In some examples, the signal reception component 525 may be configured as or otherwise support a means for receiving a command to access the first memory array, and the operating condition identification component 535 may be configured as or otherwise support a means for identifying the condition of operating the memory array circuitry 545 based at least in part on the signal reception component 525 receiving the command to access the first memory array.

In some examples, to support identifying the condition of operating the memory array circuitry 545, the operating condition identification component 535 may be configured as or otherwise support a means for identifying that a speed or a bandwidth of operating the memory array circuitry 545 satisfies a threshold.

In some examples, to support identifying the condition of operating the memory array circuitry 545, the operating condition identification component 535 may be configured as or otherwise support a means for identifying that a voltage or a current of operating the memory array circuitry 545 satisfies a threshold.

In some examples, the operating condition identification component 535 may be configured as or otherwise support a means for identifying a second condition of operating the memory array circuitry 545, and the voltage regulator connection switching component 530 may be configured as or otherwise support a means for modifying, based at least in part on the operating condition identification component 535 identifying the second condition of operating the memory array circuitry 545, the state of the switching component.

In some examples, to support modifying the state of the switching component based at least in part on the operating condition identification component 535 identifying the second condition of operating the memory array circuitry 545, the voltage regulator connection switching component 530 may be configured as or otherwise support a means for transitioning the state of the switching component from a closed-circuit state to an open-circuit state.

In some examples, to support identifying the second condition of operating the memory array circuitry 545, the operating condition identification component 535 may be configured as or otherwise support a means for identifying an idle condition or a standby condition of the memory array circuitry 545.

In some examples, to support identifying the condition of operating the memory array circuitry 545, the operating condition identification component 535 may be configured as or otherwise support a means for identifying that a second voltage or a second current associated with operating the memory array circuitry 545 satisfies a threshold.

In some examples, the memory array circuitry 545 may be configured as or otherwise support a means for operating the circuitry associated with a memory array based at least in part on modifying the state of the switching component.

Figure 6:
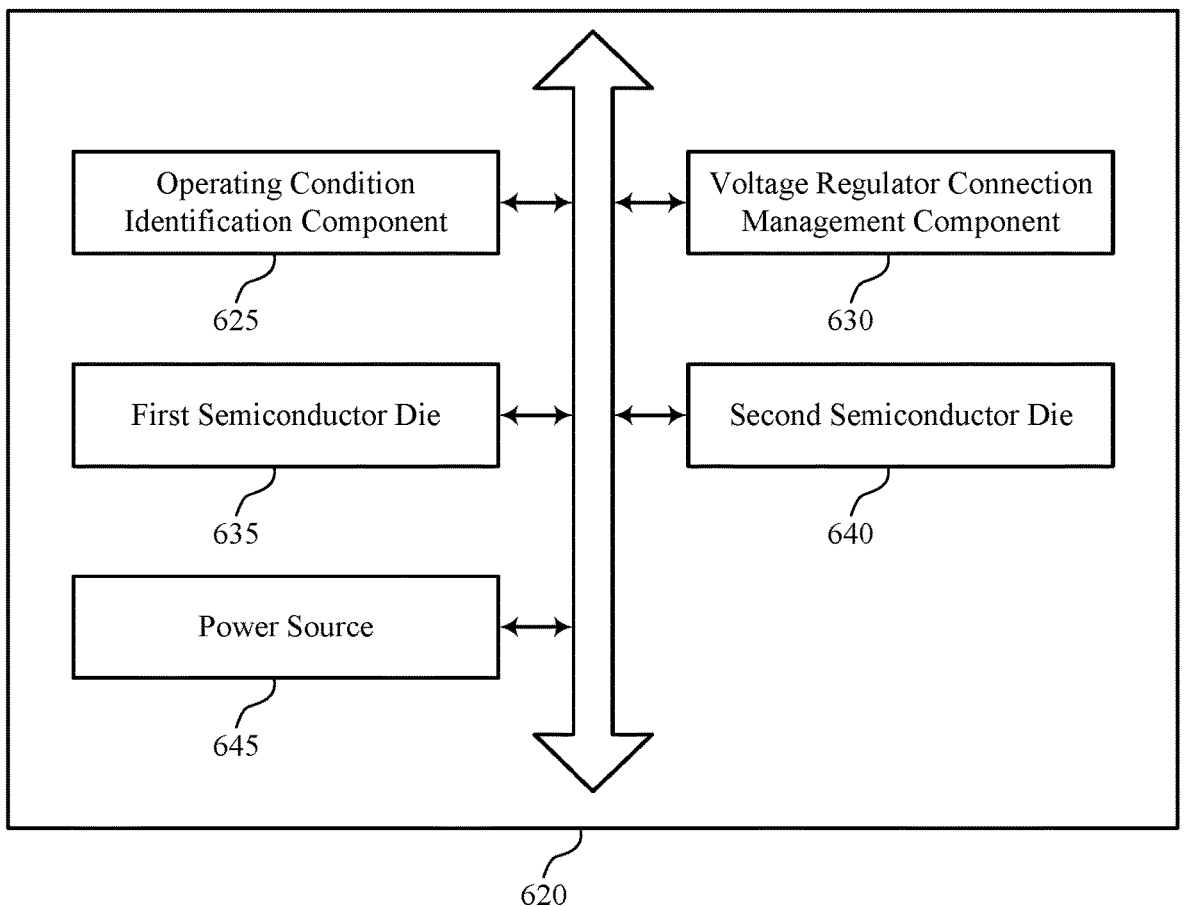
FIG. 6 shows a block diagram of a memory device that supports voltage regulation distribution for stacked memory in accordance with examples as disclosed herein.

FIG. 6 shows a block diagram 600 of a memory device 620 that supports voltage regulation distribution for stacked memory in accordance with examples as disclosed herein. The memory device 620 may be an example of aspects of a memory device as described with reference to FIGS. 1 through 4. The memory device 620, or various components thereof, may be an example of means for performing various aspects of voltage regulation distribution for stacked memory as described herein. For example, the memory device 620 may include an operating condition identification component 625 a voltage regulator connection management component 630, a first semiconductor die 635, a second semiconductor die 640, a power source 645, or any combination thereof. The first semiconductor die 635 may include circuitry associated with at least a first memory array and a first voltage regulator, which may be operable based at least in part on the power source 645, and the second semiconductor die 640 may include circuitry associated with at least a second memory array and a second voltage regulator, which also may be operable based at least in part on the power source 645. Each of these components may communicate, directly or indirectly, with one another (e.g., via one or more buses).

The operating condition identification component 625 may be configured as or otherwise support a means for identifying a condition of operating the memory device 620. The voltage regulator connection management component 630 may be configured as or otherwise support a means for modifying, based at least in part on the operating condition identification component 625 identifying the condition of operating the memory device 620, a connection between the first semiconductor die 635 and a voltage regulator of the second semiconductor die 640, or a connection between the second semiconductor die 640 and a voltage regulator of the first semiconductor die 635, or both.

In some examples, to support identifying the condition of operating the memory device 620, the operating condition identification component 625 may be configured as or otherwise support a means for identifying that a speed or a bandwidth of operating the circuitry associated with the first memory array satisfies a threshold, or identifying that a speed or a bandwidth of operating the circuitry associated with the second memory array satisfies a threshold, or both.

In some examples, to support identifying the condition of operating the memory device 620, the operating condition identification component 625 may be configured as or otherwise support a means for identifying that a power of operating the circuitry associated with the first memory array satisfies a threshold, or identifying that a power of operating the circuitry associated with the second memory array satisfies a threshold, or both.

In some examples, to support identifying the condition of operating the memory device 620, the operating condition identification component 625 may be configured as or otherwise support a means for identifying an access operation of first memory array, or identifying an access operation of the second memory array, or both.

In some examples, to support modifying the connection, the voltage regulator connection management component 630 may be configured as or otherwise support a means for modifying a state of a switching component of the first semiconductor die 635, or modifying a state of a switching component of the second semiconductor die 640, or both.

In some examples, to support modifying the connection, the voltage regulator connection management component 630 may be configured as or otherwise support a means for modifying a state of a switching component of a third semiconductor die of the memory device including the logic of the memory device 620 (e.g., a logic die).

Figure 7:
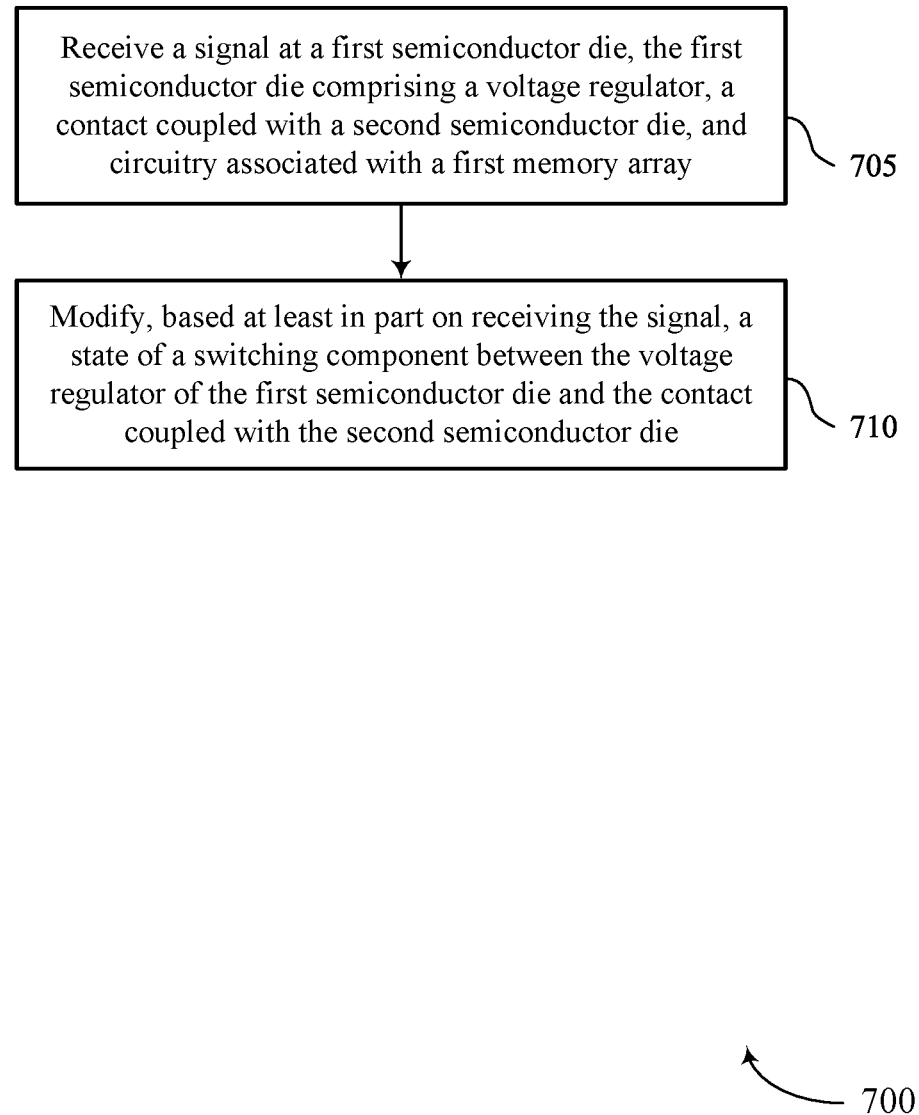
FIGS. 7 through 9 show flowcharts illustrating a method or methods that support voltage regulation distribution for stacked memory in accordance with examples as disclosed herein.

FIG. 7 shows a flowchart illustrating a method 700 that supports voltage regulation distribution for stacked memory in accordance with examples as disclosed herein. The operations of method 700 may be implemented by a semiconductor die or its components as described herein. For example, the operations of method 700 may be performed by a semiconductor die as described with reference to FIGS. 1 through 5. In some examples, a semiconductor die may execute a set of instructions to control the functional elements of the device to perform the described functions. Additionally or alternatively, the semiconductor die may perform aspects of the described functions using special-purpose hardware.

At 705, the method may include receiving a signal at a first semiconductor die, the first semiconductor die including a voltage regulator, a contact coupled with a second semiconductor die, and circuitry associated with a first memory array. In some examples, the second semiconductor die may include circuitry associated with a second memory array. The operations of 705 may be performed in accordance with examples as disclosed herein, including with reference to FIG. 3. In some examples, aspects of the operations of 705 may be performed by a signal reception component 525 as described with reference to FIG. 5.

At 710, the method may include modifying, based at least in part on receiving the signal, a state of a switching component between the voltage regulator of the first semiconductor die and the contact coupled with the second semiconductor die. The operations of 710 may be performed in accordance with examples as disclosed herein, including with reference to FIG. 3. In some examples, aspects of the operations of 710 may be performed by a voltage regulator connection switching component 530 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving a signal at a first semiconductor die, the first semiconductor die including a voltage regulator, a contact coupled with a second semiconductor die, and circuitry associated with a first memory array, and modifying, based at least in part on receiving the signal, a state of a switching component between the voltage regulator of the first semiconductor die and the contact coupled with the second semiconductor die. In some examples, the second semiconductor die may include circuitry associated with a second memory array.

In some examples of the method 700 and the apparatus described herein, receiving the signal may include operations, features, circuitry, logic, means, or instructions for receiving, at the first semiconductor die from the second semiconductor die, a request to modify the state of the switching component.

In some examples of the method 700 and the apparatus described herein, receiving the signal may include operations, features, circuitry, logic, means, or instructions for receiving, at the first semiconductor die from a third semiconductor die that is coupled with the first semiconductor die and the second semiconductor die, a command to modify the state of the switching component.

In some examples of the method 700 and the apparatus described herein, receiving the signal may include operations, features, circuitry, logic, means, or instructions for receiving, at the first semiconductor die from a host device coupled with a memory device that includes the first semiconductor die and the second semiconductor die, a command to modify the state of the switching component.

In some examples of the method 700 and the apparatus described herein, the signal may include an indication of a condition of operating the circuitry associated with the second memory array.

In some examples of the method 700 and the apparatus described herein, the indication of the condition of operating the circuitry associated with the second memory array may include an indication of a bandwidth, an indication of a performance mode, an indication of a power mode, an indication of a voltage, an indication of a current, or an indication of an access status, or a combination thereof.

In some examples of the method 700 and the apparatus described herein, modifying the state of the switching component may isolate the voltage regulator from the circuitry associated with the first memory array.

In some examples of the method 700 and the apparatus described herein, modifying the state of the switching component may include operations, features, circuitry, logic, means, or instructions for transitioning the state of the switching component from a closed-circuit state to an open-circuit state based at least in part on receiving the signal.

Some examples of the method 700 and the apparatus described herein may further include operations, features, circuitry, logic, means, or instructions for receiving a second signal at the first semiconductor die and modifying, based at least in part on receiving the second signal, the state of the switching component from the open-circuit state to the closed-circuit state.

Figure 8:
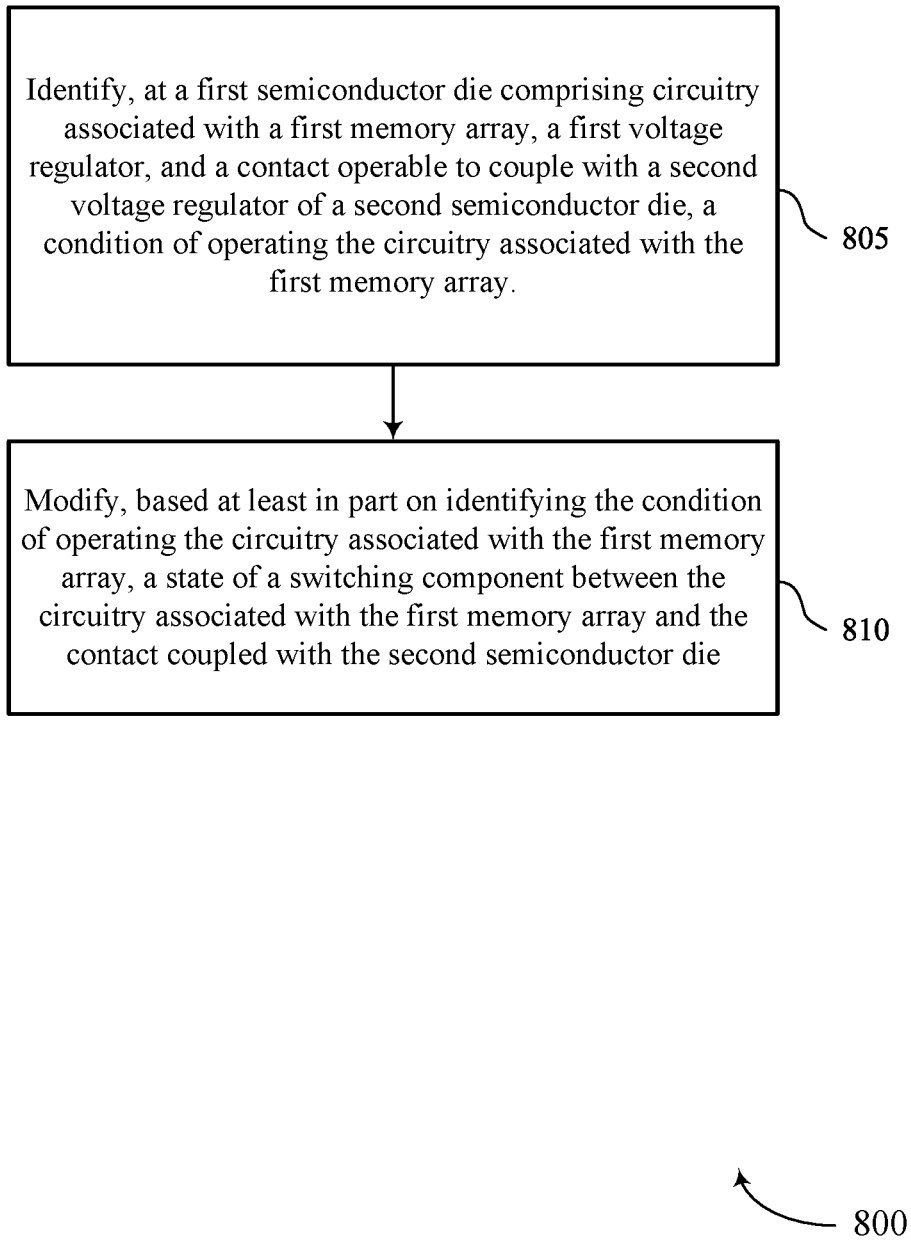

FIG. 8 shows a flowchart illustrating a method 800 that supports voltage regulation distribution for stacked memory in accordance with examples as disclosed herein. The operations of method 800 may be implemented by a semiconductor die or its components as described herein. For example, the operations of method 800 may be performed by a semiconductor die as described with reference to FIGS. 1 through 5. In some examples, a semiconductor die may execute a set of instructions to control the functional elements of the device to perform the described functions. Additionally or alternatively, the semiconductor die may perform aspects of the described functions using special-purpose hardware.

At 805, the method may include identifying, at a first semiconductor die including circuitry associated with a first memory array, a first voltage regulator, and a contact operable to couple with a second voltage regulator of a second semiconductor die, a condition of operating the circuitry associated with the first memory array. In some examples, the second semiconductor die may include circuitry associated with a second memory array. The operations of 805 may be performed in accordance with examples as disclosed herein, including with reference to FIG. 3. In some examples, aspects of the operations of 805 may be performed by an operating condition identification component 535 as described with reference to FIG. 5.

At 810, the method may include modifying, based at least in part on identifying the condition of operating the circuitry associated with the first memory array, a state of a switching component between the circuitry associated with the first memory array and the contact operable to couple with the second voltage regulator of the second semiconductor die. The operations of 810 may be performed in accordance with examples as disclosed herein, including with reference to FIG. 3. In some examples, aspects of the operations of 810 may be performed by a voltage regulator connection switching component 530 as described with reference to FIG. 5.

In some examples, an apparatus as described herein may perform a method or methods, such as the method 800. The apparatus may include, features, circuitry, logic, means, or instructions (e.g., a non-transitory computer-readable medium storing instructions executable by a processor) for identifying, at a first semiconductor die including circuitry associated with a first memory array, a first voltage regulator, and a contact operable to couple with a second voltage regulator of a second semiconductor die, a condition of operating the circuitry associated with the first memory array, and modifying, based at least in part on identifying the condition of operating the circuitry associated with the first memory array, a state of a switching component between the circuitry associated with the first memory array and the contact operable to couple with the second voltage regulator of the second semiconductor die. In some examples, the second semiconductor die may include circuitry associated with a second memory array.

In some examples of the method 800 and the apparatus described herein, modifying the state of the switching component based at least in part on identifying the condition of operating the circuitry associated with the first memory array may include operations, features, circuitry, logic, means, or instructions for transitioning the state of the switching component from an open-circuit state to a closed-circuit state based at least in part on identifying the condition of operating the circuitry associated with the first memory array.

In some examples of the method 800 and the apparatus described herein, modifying the state of the switching component based at least in part on identifying the condition of operating the circuitry associated with the first memory array may include operations, features, circuitry, logic, means, or instructions for transitioning the state of the switching component from a closed-circuit state to an open-circuit state based at least in part on identifying the condition of operating the circuitry associated with the first memory array.

Some examples of the method 800 and the apparatus described herein may further include operations, features, circuitry, logic, means, or instructions for transmitting a signal to the second semiconductor die, the signal to modify a state of a second switching component between the second voltage regulator of the second semiconductor die and a contact of the second semiconductor die coupled with the first semiconductor die.

Some examples of the method 800 and the apparatus described herein may further include operations, features, circuitry, logic, means, or instructions for receiving a command to access the first memory array and identifying the condition of operating the circuitry associated with the first memory array based at least in part on receiving the command to access the first memory array.

In some examples of the method 800 and the apparatus described herein, identifying the condition of operating the circuitry associated with the first memory array may include operations, features, circuitry, logic, means, or instructions for identifying that a speed or a bandwidth of operating the circuitry associated with the first memory array satisfies a threshold.

In some examples of the method 800 and the apparatus described herein, identifying the condition of operating the circuitry associated with the first memory array may include operations, features, circuitry, logic, means, or instructions for identifying that a voltage or a current of operating the circuitry associated with the first memory array satisfies a threshold.

Some examples of the method 800 and the apparatus described herein may further include operations, features, circuitry, logic, means, or instructions for identifying, at the first semiconductor die, a second condition of operating the circuitry associated with the first memory array of the circuitry associated with the first memory array and modifying, based at least in part on identifying the second condition of operating the circuitry associated with the first memory array, the state of the switching component.

In some examples of the method 800 and the apparatus described herein, modifying the state of the switching component based at least in part on identifying the second condition of operating the circuitry associated with the first memory array may include operations, features, circuitry, logic, means, or instructions for transitioning the state of the switching component from a closed-circuit state to an open-circuit state.

In some examples of the method 800 and the apparatus described herein, identifying the second condition of operating the circuitry associated with the first memory array may include operations, features, circuitry, logic, means, or instructions for identifying an idle condition or a standby condition of the circuitry associated with the first memory array.

In some examples of the method 800 and the apparatus described herein, identifying the condition of operating the circuitry associated with the first memory array may include operations, features, circuitry, logic, means, or instructions for identifying that a second voltage or a second current associated with operating the circuitry associated with the first memory array satisfies a threshold.

Some examples of the method 800 and the apparatus described herein may further include operations, features, circuitry, logic, means, or instructions for operating the circuitry associated with the first memory array based at least in part on modifying the state of the switching component.

Figure 9:
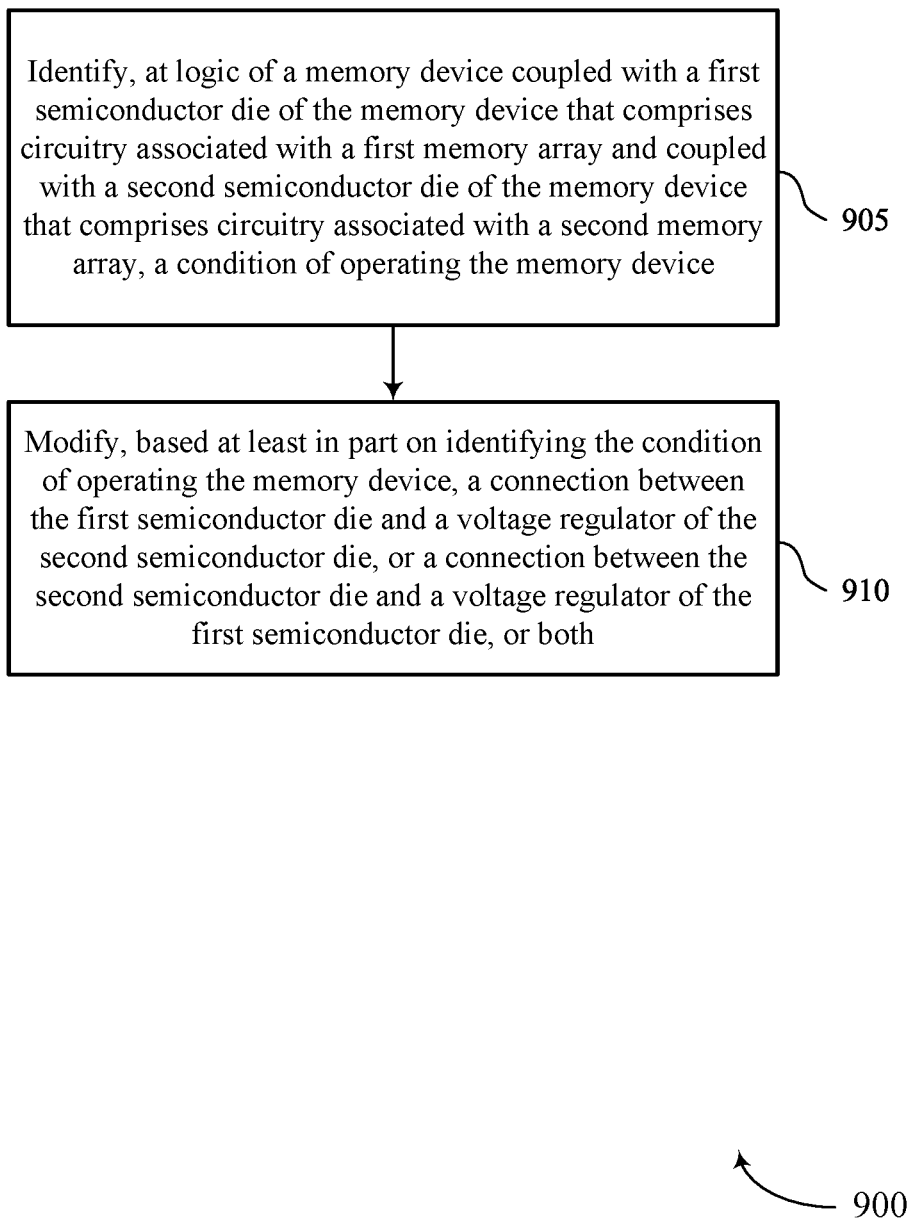

FIG. 9 shows a flowchart illustrating a method 900 that supports voltage regulation distribution for stacked memory in accordance with examples as disclosed herein. The operations of method 900 may be implemented by a memory device or its components as described herein. For example, the operations of method 900 may be performed by a memory device as described with reference to FIGS. 1 through 4 and 6. In some examples, a memory device may execute a set of instructions to control the functional elements of the device to perform the described functions. Additionally or alternatively, the memory device may perform aspects of the described functions using special-purpose hardware.

At 905, the method may include identifying, at logic of a memory device coupled with a first semiconductor die of the memory device that includes circuitry associated with a first memory array and coupled with a second semiconductor die of the memory device that includes circuitry associated with a second memory array, a condition of operating the memory device. The operations of 905 may be performed in accordance with examples as disclosed herein, including with reference to FIG. 3. In some examples, aspects of the operations of 905 may be performed by an operating condition identification component 625 as described with reference to FIG. 6.

At 910, the method may include modifying, based at least in part on identifying the condition of operating the memory device, a connection between the first semiconductor die and a voltage regulator of the second semiconductor die, or a connection between the second semiconductor die and a voltage regulator of the first semiconductor die, or both. The operations of 910 may be performed in accordance with examples as disclosed herein, including with reference to FIG. 3. In some examples, aspects of the operations of 910 may be performed by a voltage regulator connection management component 630 as described with reference to FIG. 6.

In some examples, an apparatus as described herein may perform a method or methods, such as the method 900. The apparatus may include, features, circuitry, logic, means, or instructions (e.g., a non-transitory computer-readable medium storing instructions executable by a processor) for identifying, at logic of a memory device coupled with a first semiconductor die of the memory device that includes circuitry associated with a first memory array and coupled with a second semiconductor die of the memory device that includes circuitry associated with a second memory array, a condition of operating the memory device and modifying, based at least in part on identifying the condition of operating the memory device, a connection between the first semiconductor die and a voltage regulator of the second semiconductor die, or a connection between the second semiconductor die and a voltage regulator of the first semiconductor die, or both.

In some examples of the method 900 and the apparatus described herein, identifying the condition of operating the memory device may include operations, features, circuitry, logic, means, or instructions for identifying that a speed or a bandwidth of operating the circuitry associated with the first memory array satisfies a threshold, or identifying that a speed or a bandwidth of operating the circuitry associated with the second memory array satisfies a threshold, or both.

In some examples of the method 900 and the apparatus described herein, identifying the condition of operating the memory device may include operations, features, circuitry, logic, means, or instructions for identifying that a power of operating the circuitry associated with the first memory array satisfies a threshold, or identifying that a power of operating the circuitry associated with the second memory array satisfies a threshold, or both.

In some examples of the method 900 and the apparatus described herein, identifying the condition of operating the memory device may include operations, features, circuitry, logic, means, or instructions for identifying an access operation of first memory array, or identifying an access operation of the second memory array, or both.

In some examples of the method 900 and the apparatus described herein, modifying the connection may include operations, features, circuitry, logic, means, or instructions for modifying a state of a switching component of the first semiconductor die, or modifying a state of a switching component of the second semiconductor die, or both.

In some examples of the method 900 and the apparatus described herein, modifying the connection may include operations, features, circuitry, logic, means, or instructions for modifying a state of a switching component of a third semiconductor die of the memory device including the logic of the memory device.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a first semiconductor die including a first voltage regulator, circuitry associated with a first memory array and operable based at least in part on the first voltage regulator, a contact operable to couple with a second voltage regulator of a second semiconductor die, and a switching component coupled between the contact and the circuitry associated with the first memory array.

In some examples, the apparatus may include logic operable to control a state of the switching component based at least in part on a condition of operating the circuitry associated with the first memory array.

In some examples, the apparatus may include logic operable to control a state of the switching component based at least in part on a signal received from outside the first semiconductor die.

In some examples, the apparatus may include a fourth contact configured for receiving the signal from outside the first semiconductor die.

In some examples, the apparatus may include logic operable to transmit a signal to the second semiconductor die, the signal to modify a state of a second switching component coupled between the contact of the first semiconductor die and a second voltage regulator of the second semiconductor die.

In some examples, the apparatus may include a fifth contact configured for transmitting the signal to the second semiconductor die.

Another apparatus is described. The apparatus may include a first semiconductor die including a first voltage regulator and circuitry associated with a first memory array, a second semiconductor die including a second voltage regulator and circuitry associated with a second memory array, a power supply located outside the first semiconductor die and the second semiconductor die and operable to couple with the first voltage regulator and the second voltage regulator, a first switching component operable to couple or isolate the second voltage regulator and the circuitry associated with the first memory array, and a second switching component operable to couple or isolate the first voltage regulator and the circuitry associated with the second memory array.

In some examples of the apparatus, the first switching component may be located in the first semiconductor die and the second switching component may be located in the second semiconductor die.

In some examples of the apparatus, the first switching component and the second switching component may be located in a third semiconductor die that may be coupled with the first semiconductor die and the second semiconductor die.

In some examples, the apparatus may include one or more conductors operable to directly couple the power supply with the first voltage regulator, with the second voltage regulator, or both.

Another apparatus is described. The apparatus may include a first semiconductor die including a voltage regulator, circuitry associated with a first memory array and operable based at least in part on the voltage regulator, a contact operable to couple with a second semiconductor die including a second memory array, a switching component between the voltage regulator and the contact, logic configured to, receive a signal at the first semiconductor die, and modify a state of the switching component based at least in part on receiving the signal.

Another apparatus is described. The apparatus may include a first semiconductor die including a voltage regulator, circuitry associated with a first memory array and operable based at least in part on the voltage regulator, a contact operable to couple with a second voltage regulator of a second semiconductor die, a switching component between the contact and the circuitry associated with the first memory array, logic configured to, identify a condition of operating the circuitry associated with the first memory array, and modify a state of the switching component based at least in part on identifying the condition of operating the circuitry associated with the first memory array.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method comprising:
   receiving a signal at a first semiconductor die, the first semiconductor die comprising a voltage regulator, a first contact coupled with a second contact of a second semiconductor die, and circuitry associated with a first memory array, the second semiconductor die comprising circuitry associated with a second memory array having a power input that is operable to couple with the second contact; and
   modifying, based at least in part on receiving the signal, a state of a switching component of the first semiconductor die between the voltage regulator of the first semiconductor die and the first contact, the switching component operable to couple the voltage regulator of the first semiconductor die with the power input of the circuitry associated with the second memory array or isolate the voltage regulator of the first semiconductor die from the power input of the circuitry associated with the second memory array.

2. The method of claim 1, wherein receiving the signal comprises:
   receiving, at the first semiconductor die from the second semiconductor die, a request to modify the state of the switching component.

3. The method of claim 1, wherein receiving the signal comprises:
   receiving, at the first semiconductor die from a third semiconductor die that is coupled with the first semiconductor die and the second semiconductor die, a command to modify the state of the switching component.

4. The method of claim 1, wherein receiving the signal comprises:
   receiving, at the first semiconductor die from a host device coupled with a memory device that includes the first semiconductor die and the second semiconductor die, a command to modify the state of the switching component.

5. The method of claim 1, wherein the signal comprises an indication of a condition of operating the circuitry associated with the second memory array.

6. The method of claim 5, wherein the indication of the condition of operating the circuitry associated with the second memory array comprises an indication of a bandwidth, an indication of a performance mode, an indication of a power mode, an indication of a voltage, an indication of a current, or an indication of an access status, or a combination thereof.

7. The method of claim 1, wherein modifying the state of the switching component isolates the voltage regulator from the circuitry associated with the first memory array.

8. The method of claim 1, wherein modifying the state of the switching component comprises:
   transitioning the state of the switching component from a closed-circuit state to an open-circuit state based at least in part on receiving the signal.

9. The method of claim 8, further comprising:
   receiving a second signal at the first semiconductor die; and
   modifying, based at least in part on receiving the second signal, the state of the switching component from the open-circuit state to the closed-circuit state.

10. A method, comprising:
    identifying, at a first semiconductor die comprising circuitry associated with a first memory array having a power input for operations of the first memory array, a first voltage regulator, and a contact operable to couple with a second voltage regulator of a second semiconductor die, a condition of operating the circuitry associated with the first memory array, the second semiconductor die comprising circuitry associated with a second memory array; and
    modifying, based at least in part on identifying the condition of operating the circuitry associated with the first memory array, a state of a switching component of the first semiconductor die between the power input of the circuitry associated with the first memory array and the contact operable to couple with the second voltage regulator of the second semiconductor die, the switching component operable to couple the second voltage regulator of the second semiconductor die with the power input for operations of the first memory array or isolate the second voltage regulator of the second semiconductor die from the power input for operations of the first memory array.

11. The method of claim 10, wherein modifying the state of the switching component based at least in part on identifying the condition of operating the circuitry associated with the first memory array comprises:
transitioning the state of the switching component from an open-circuit state to a closed-circuit state based at least in part on identifying the condition of operating the circuitry associated with the first memory array.

12. The method of claim 10, wherein modifying the state of the switching component based at least in part on identifying the condition of operating the circuitry associated with the first memory array comprises:
transitioning the state of the switching component from a closed-circuit state to an open-circuit state based at least in part on identifying the condition of operating the circuitry associated with the first memory array.

13. The method of claim 10, further comprising:
transmitting a signal to the second semiconductor die, the signal to modify a state of a second switching component between the second voltage regulator of the second semiconductor die and a contact of the second semiconductor die coupled with the first semiconductor die.

14. The method of claim 10, further comprising:
receiving a command to access the first memory array; and
identifying the condition of operating the circuitry associated with the first memory array based at least in part on receiving the command to access the first memory array.

15. The method of claim 10, wherein identifying the condition of operating the circuitry associated with the first memory array comprises:
identifying that a speed or a bandwidth of operating the circuitry associated with the first memory array satisfies a threshold.

16. The method of claim 10, wherein identifying the condition of operating the circuitry associated with the first memory array comprises:
identifying that a voltage or a current of operating the circuitry associated with the first memory array satisfies a threshold.

17. The method of claim 10, further comprising:
identifying, at the first semiconductor die, a second condition of operating the circuitry associated with the first memory array; and
modifying, based at least in part on identifying the second condition of operating the circuitry associated with the first memory array, the state of the switching component.

18. The method of claim 17, wherein modifying the state of the switching component based at least in part on identifying the second condition of operating the circuitry associated with the first memory array comprises:
transitioning the state of the switching component from a closed-circuit state to an open-circuit state.

19. The method of claim 17, wherein identifying the second condition of operating the circuitry associated with the first memory array comprises:
identifying an idle condition or a standby condition of the circuitry associated with the first memory array.

20. The method of claim 17, wherein identifying the condition of operating the circuitry associated with the first memory array comprises:
identifying that a second voltage or a second current associated with operating the circuitry associated with the first memory array satisfies a threshold.

21. A method comprising:
identifying, at logic of a memory device coupled with a first semiconductor die of the memory device that comprises circuitry associated with a first memory array having a first power input and coupled with a second semiconductor die of the memory device that comprises circuitry associated with a second memory array having a second power input, a condition of operating the memory device; and
modifying, based at least in part on identifying the condition of operating the memory device, a connection between the first power input of the circuitry associated with the first memory array of the first semiconductor die and a voltage regulator of the second semiconductor die, or a connection between the second power input of the circuitry associated with the second memory array of the second semiconductor die and a voltage regulator of the first semiconductor die, or both.

22. The method of claim 21, wherein identifying the condition of operating the memory device comprises:
identifying that a speed or a bandwidth of operating the circuitry associated with the first memory array satisfies a threshold, or identifying that a speed or a bandwidth of operating the circuitry associated with the second memory array satisfies a threshold, or both.

23. The method of claim 21, wherein identifying the condition of operating the memory device comprises:
identifying that a power of operating the circuitry associated with the first memory array satisfies a threshold, or identifying that a power of operating the circuitry associated with the second memory array satisfies a threshold, or both.

24. The method of claim 21, wherein identifying the condition of operating the memory device comprises:
identifying an access operation of the first memory array, or identifying an access operation of the second memory array, or both.

25. The method of claim 21, wherein modifying the connection comprises:
modifying a state of a switching component of the first semiconductor die, or modifying a state of a switching component of the second semiconductor die, or both.

26. The method of claim 21, wherein modifying the connection comprises:
modifying a state of a switching component of a third semiconductor die of the memory device comprising the logic of the memory device.

27. An apparatus, comprising:
a first semiconductor die, comprising:
a first voltage regulator;
circuitry associated with a first memory array having a power input, and the circuitry associated with the first memory array operable based at least in part on power provided from the first voltage regulator via the power input;
a contact operable to couple with a second voltage regulator of a second semiconductor die; and
a switching component coupled between the contact and the circuitry associated with the first memory array, the switching component operable to couple the second voltage regulator of the second semiconductor die with the power input of the circuitry associated with the first memory array or isolate the second voltage regulator of the second semiconductor die from the power input of the circuitry associated with the first memory array.

28. The apparatus of claim 27, further comprising:
logic operable to control a state of the switching component based at least in part on a condition of operating the circuitry associated with the first memory array.

29. The apparatus of claim 27, further comprising:
logic operable to control a state of the switching component based at least in part on a signal received from outside the first semiconductor die.

30. The apparatus of claim 29, further comprising:
a fourth contact configured for receiving the signal from outside the first semiconductor die.

31. The apparatus of claim 27, further comprising:
logic operable to transmit a signal to the second semiconductor die, the signal to modify a state of a second switching component coupled between the contact of the first semiconductor die and the second voltage regulator of the second semiconductor die.

32. An apparatus, comprising:
a first semiconductor die comprising a first voltage regulator and circuitry associated with a first memory array having a first power input for operations of the first memory array;
a second semiconductor die comprising a second voltage regulator and circuitry associated with a second memory array having a second power input for operations of the second memory array;
a power supply located outside the first semiconductor die and the second semiconductor die, and operable to couple with the first voltage regulator and the second voltage regulator;
a first switching component operable to couple the second voltage regulator of the second semiconductor die with the first power input of the circuitry associated with the first memory array of the first semiconductor die; and
a second switching component operable to couple the first voltage regulator of the first semiconductor die with the second power input of the circuitry associated with the second memory array of the second semiconductor die.

33. The apparatus of claim 32, wherein the first switching component is located in the first semiconductor die and the second switching component is located in the second semiconductor die.

34. The apparatus of claim 32, wherein the first switching component and the second switching component are located in a third semiconductor die that is coupled with the first semiconductor die and the second semiconductor die.

35. The apparatus of claim 32, further comprising:
one or more conductors operable to directly couple the power supply with the first voltage regulator, with the second voltage regulator, or both.

* * * * *